United States Patent
Kang et al.

(10) Patent No.: US 10,025,139 B2
(45) Date of Patent: Jul. 17, 2018

(54) DISPLAY DEVICE

(71) Applicant: SAMSUNG DISPLAY CO., LTD., Yongin-si (KR)

(72) Inventors: Jonghyuk Kang, Suwon-si (KR); Daehyun Kim, Hwaseong-si (KR); Hyundeok Im, Seoul (KR); Jaewoong Kang, Jeonju-si (KR); Jaebyung Park, Seoul (KR); Hyunmin Cho, Seoul (KR); Sungjin Hong, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 248 days.

(21) Appl. No.: 14/994,885

(22) Filed: Jan. 13, 2016

(65) Prior Publication Data

US 2016/0201858 A1    Jul. 14, 2016

(30) Foreign Application Priority Data

Jan. 13, 2015  (KR) .................. 10-2015-0006461
Nov. 3, 2015   (KR) .................. 10-2015-0153725

(51) Int. Cl.
*G02F 1/1335*     (2006.01)
*F21V 8/00*       (2006.01)
(Continued)

(52) U.S. Cl.
CPC .......... *G02F 1/133617* (2013.01); *F21V 9/30* (2018.02); *G02B 6/005* (2013.01); *G02B 6/0073* (2013.01); *G02F 1/1336* (2013.01); *G02F 1/13362* (2013.01); *H01L 33/504* (2013.01); *H01L 33/56* (2013.01); *G02F 1/133602* (2013.01); *G02F 1/133615* (2013.01);
(Continued)

(58) Field of Classification Search
CPC ............ G02F 1/133617; G02F 1/1336; G02F 1/13362; H01L 33/504; H01L 33/56; G02B 6/0073; G02B 6/005; F21V 9/16
See application file for complete search history.

(56) References Cited

U.S. PATENT DOCUMENTS 8,409,727 B2   4/2013  Yang et al.
8,504,113 B2   8/2013  Kim et al.
(Continued)

FOREIGN PATENT DOCUMENTS

KR   1020070069418   7/2007
KR   1020070069419   7/2007
KR   1020120109913   10/2012

OTHER PUBLICATIONS

Toru Takahashi, et al., "Mn4+—Activated Red Photoluminescence in K2SiF6 Phosphor", Journal of the Electrochemical Society, (2008), vol. 155, No. 12, pp. E183-E188.
(Continued)

*Primary Examiner* — David V Bruce
(74) *Attorney, Agent, or Firm* — Cantor Colburn LLP

(57) ABSTRACT

A display device includes: a display panel; a light source which supplies light to the display panel; and a light converting member which converts a portion of the light emitted from the light source into light in a wavelength range of about 500 nanometers (nm) to about 580 nm, where the light source includes: a light emitting diode; and red phosphors.

41 Claims, 16 Drawing Sheets

(51) Int. Cl.
    G02F 1/13357    (2006.01)
    H01L 33/50      (2010.01)
    H01L 33/56      (2010.01)
    F21V 9/30       (2018.01)
(52) U.S. Cl.
    CPC ............ *G02F 2001/133614* (2013.01); *G02F 2001/133622* (2013.01); *G02F 2202/108* (2013.01); *G02F 2203/68* (2013.01)

(56) References Cited

U.S. PATENT DOCUMENTS

| | | | |
|---|---|---|---|
| 2010/0103648 A1* | 4/2010 | Kim | H01L 33/507 362/97.1 |
| 2010/0224895 A1 | 9/2010 | Murazaki et al. | |
| 2012/0250351 A1 | 10/2012 | Shin et al. | |
| 2014/0009964 A1 | 1/2014 | Dubrow et al. | |
| 2014/0153217 A1 | 6/2014 | Kang | |
| 2014/0362556 A1* | 12/2014 | Cho | B32B 3/30 362/19 |

OTHER PUBLICATIONS

European Examination Report for Application No. 16150954.2 dated Apr. 24, 2017.
European Extended Search Report for application No. 16150954.2 dated Jul. 15, 2016.
European Partial Search Report for Application No. 18157715.6 dated Mar. 21, 2018, citing the above reference(s).

\* cited by examiner

DISPLAY DEVICE

This application claims priority to Korean Patent Application No. 10-2015-0153725, filed on Nov. 3, 2015, and to Korean Patent Application No. 10-2015-0006461, filed on Jan. 13, 2015, and all the benefits accruing therefrom under 35 U.S.C. § 119, the contents of which in their entirety are herein incorporated by reference.

BACKGROUND

1. Field

Exemplary embodiments of the invention relate to a display device, and more particularly, to a display device that enhances color gamut and luminance.

2. Description of the Related Art

A liquid crystal display ("LCD") device is one of the most widely used types of flat panel display ("FPD") device. An LCD device generally includes an LCD panel including two display substrates having electrodes therein and a liquid crystal layer interposed between the two display substrates. In the LCD device, liquid crystal molecules of the liquid crystal layer are realigned by voltages that are applied to the two electrodes, thereby adjusting the amount of light being transmitted therethrough and displaying an image on the LCD device. Due to being a non-emissive type display panel, the LCD panel included in the LCD device utilizes a backlight unit for supplying light to the LCD panel.

In recent, a light emitting diode ("LED") light source with relatively low power consumption and relatively high efficiency is widely used as a light source for the LCD device. The LED light source may emit blue light, and supply white light to the LCD panel by using other color converting materials such as phosphors and the like. Accordingly, research on enhancing a color gamut of blue light is garnering attention because the LCD device provides full-color display by using the converted white light, through a color filter of the LCD panel.

Further, the LCD device may employ a light converting member including quantum dots to convert blue light into white light. Since recently used quantum dots include cadmium (Cd), issues related to environmental pollution and adverse health effects may arise.

However, cadmium-free quantum dots, which are manufactured without cadmium in consideration of environmental pollution and adverse health effects, have a greater full width at half maximum ("FWHM") than that of quantum dots including cadmium, thus having a relatively small color gamut and short lifespan.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the invention are directed to a display device that reduces environmental pollution and enhances luminance and color gamut.

According to an exemplary embodiment of the invention, a display device includes: a display panel; a light source which supplies light to the display panel; and a light converting member which converts a portion of the light emitted from the light source into light in a wavelength range of about 500 nanometers (nm) to about 580 nm, where the light source includes: a light emitting diode; and red phosphors.

In an exemplary embodiment, the light emitting diode may emit light in a wavelength range of about 400 nm to about 500 nm.

In an exemplary embodiment, the light emitting diode may emit light in a wavelength range of about 300 nm to about 400 nm.

In an exemplary embodiment, the light source may further include blue phosphors.

In an exemplary embodiment, the light source may further include a resin on the light emitting diode, and the red phosphors may be dispersed in the resin.

In an exemplary embodiment, a content of the red phosphors may be in a range of about 2 percent by weight (wt %) to about 30 wt % with respect to a total weight of the resin and the red phosphors.

In an exemplary embodiment, the light emitted from the light source may have an x coordinate in a range of about 0.1654 to about 0.255 and a y coordinate in a range of about 0.0258 to about 0.0734 based on the International Commission on Illumination (CIE) 1931 chromaticity diagram.

In an exemplary embodiment, the light source may emit light in a wavelength range of about 580 nm to about 670 nm and light in a wavelength range of about 400 nm to about 500 nm at a light amount ratio in a range of about 1:1.8 to about 1:29.5.

In an exemplary embodiment, a light amount ratio of the light emitted from the light source and in the wavelength range of about 400 nm to about 500 nm with respect to light emitted from the light converting member and in the wavelength range of about 400 nm to about 500 nm may be in a range of about 1.6:1 to about 2.7:1.

In an exemplary embodiment, the light converting member may emit light in a wavelength range of about 500 nm to about 580 nm and the light in the wavelength range of about 400 nm to about 500 nm at a light amount ratio in a range of about 1:1.2 to about 1:3.

In an exemplary embodiment, the light source may further include a lens which encapsulates the light emitting diode and the resin.

In an exemplary embodiment, the display device may further include a circuit board on which the light source is disposed.

In an exemplary embodiment, the light converting member may include a polymer resin and green quantum dots dispersed in the polymer resin.

In an exemplary embodiment, the light converting member may further include a protective layer which seals the polymer resin.

In an exemplary embodiment, the protective layer may have a bar shape.

In an exemplary embodiment, the protective layer may include a first glass and a second glass facing the first glass.

In an exemplary embodiment, the light converting member may emit white light to the display panel.

In an exemplary embodiment, the display device may further include a light guide plate which receives the light emitted from the light source incident on a side surface of the light guide plate, and emits the incident light to the display panel.

In an exemplary embodiment, the light converting member may be between the light guide plate and the display panel.

In an exemplary embodiment, the display device may further include an optical sheet between the light guide plate and the display panel.

In an exemplary embodiment, the light converting member may be between the light guide plate and the optical sheet.

In an exemplary embodiment, the display device may further include a diffusion plate between the light source and the display panel.

In an exemplary embodiment, the light converting member may be between the diffusion plate and the display panel.

In an exemplary embodiment, the red phosphor may include at least one selected from a nitride-based red phosphor, a fluoride-based red phosphor, a silicate-based red phosphor, a sulfide-based red phosphor, a selenide-based red phosphor, an oxynitride-based red phosphor, a molybdate-based red phosphor, a tantalate-based red phosphor, carbide-nitride, a tungstate-based red phosphor, $Sr_2MgAl_{22}O_{36}$:$Mn^{4+}$, $(Ba,Sr,Ca)_2MgAl_{16}O_{27}$:$Eu^{2+}$, $(Ba,Sr,Ca)_2MgAl_{16}O_{27}$:$Mn^{2+}$, $Sr_4Al_{14}O_{460}$:$Eu^{2+}$, and $Mg_4O_{5.5}GeF$:$Mn^{4+}$.

In an exemplary embodiment, the green quantum dot may include: a core including Group II-VI semiconductor compounds or Group III-V semiconductor compounds; and an outer shell surrounding the core.

In an exemplary embodiment, the core may include at least one selected from cadmium selenide (CdSe), cadmium telluride (CdTe), cadmium sulfide (CdS), indium phosphide (InP), indium gallium phosphide (InGaP), and indium zinc phosphide (InZnP).

In an exemplary embodiment, the outer shell may include at least one selected from CdSe, zinc sulfide (ZnS), and zinc selenide sulfide (ZnSeS).

In an exemplary embodiment, the display panel may include: a first substrate; a second substrate facing the first substrate; and a liquid crystal layer between the first substrate and the second substrate.

In an exemplary embodiment, the light converting member may be between the first substrate and the liquid crystal layer.

In an exemplary embodiment, the light converting member may be between the second substrate and the liquid crystal layer.

In an exemplary embodiment, the display panel may further include: a first polarizer disposed on an outer side of the first substrate; and a second polarizer disposed on an outer side of the second substrate.

In an exemplary embodiment, the light converting member may be disposed on an outer side of the first polarizer.

In an exemplary embodiment, the light converting member may be between the first polarizer and the first substrate.

In an exemplary embodiment, the light converting member may be disposed on an outer side of the second polarizer.

In an exemplary embodiment, the light converting member may be between the second polarizer and the second substrate.

In an exemplary embodiment, the light converting member may include a resin layer and green quantum rods arranged in the resin layer in a predetermined direction.

In an exemplary embodiment, longitudinal axes of the green quantum rods may be aligned in the predetermined direction.

In an exemplary embodiment, the green quantum rod may have one of a hexagonal crystal structure, a wurtzite crystal structure, and a zinc blende crystal structure.

According to another exemplary embodiment of the invention, a display device includes: a display panel; a first light source unit which supplies a first light in a wavelength range of about 400 nm to about 500 nm to the display panel; a second light source unit which supplies a second light in a wavelength range of about 580 nm to about 670 nm to the display panel; and a light converting member which converts a portion of the first light emitted from the first light source unit into light in a wavelength range of about 500 nm to about 580 nm.

In an exemplary embodiment, the light converting member may include a polymer resin and green quantum dots dispersed in the polymer resin.

In an exemplary embodiment, the display panel may display an image in a frame unit, and the first light source unit and the second light source unit emit the first light and the second light during a first sub-field and a second sub-field, respectively, where the first sub-field and the second sub-field are defined by temporally dividing a frame.

The foregoing is illustrative only and is not intended to be in any way limiting. In addition to the illustrative exemplary embodiments, embodiments, and features described above, further exemplary embodiments, embodiments, and features will become apparent by reference to the drawings and the following detailed description.

BRIEF DESCRIPTION OF THE DRAWINGS

The above and other features and exemplary embodiments of the invention of invention will be more clearly understood from the following detailed description taken in conjunction with the accompanying drawings, in which.

DETAILED DESCRIPTION

Figure 1:
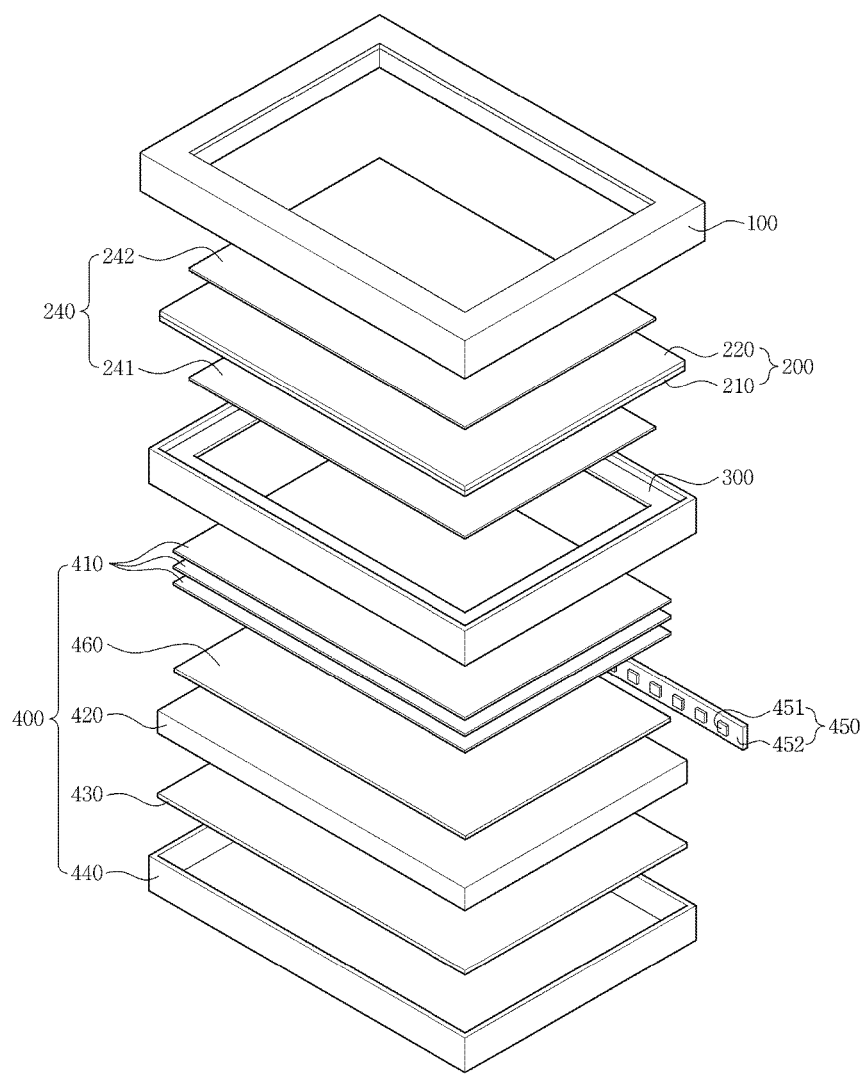
FIG. 1 is a schematic exploded perspective view illustrating a display device according to an exemplary embodiment.

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted. Like reference numerals refer to like elements throughout the specification.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of a display device will be described with reference to FIGS. 1 to 13.

Figure 2:
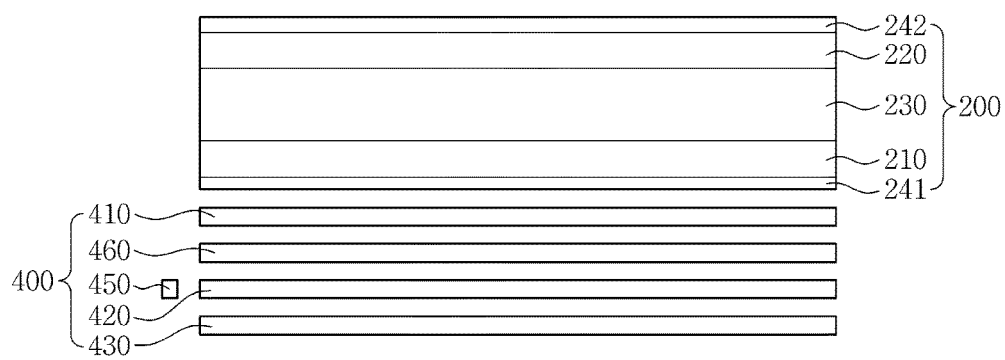
FIG. 2 is a cross-sectional view illustrating a display panel and a backlight unit of FIG. 1.

FIG. 1 is a schematic exploded perspective view illustrating the display device according to an exemplary embodiment. FIG. 2 is a cross-sectional view illustrating a display panel 200 and a backlight unit 400 of FIG. 1.

Referring to FIGS. 1 and 2, an exemplary embodiment of the display device includes the display panel 200 configured to display images, the backlight unit 400 configured to supply light to the display panel 200, an upper frame 100 surrounding the display panel 200, and an intermediate frame 300 on which the display panel 200 is disposed.

The upper frame 100 is coupled to a lower frame 440 to cover an edge of the display panel 200 disposed on the intermediate frame 300. The edge of the display panel 200 covered by the upper frame 100 may be a non-display area. An opening, through which the display panel 200 is exposed, is defined in a center portion of the upper frame 100.

In one exemplary embodiment, for example, the upper frame 100 may be fastened to the lower frame 440 through hook-coupling and/or screw-coupling, but the invention is not limited thereto. In an alternative exemplary embodiment, the coupling between the upper frame 100 and the lower frame 440 may be modified in various manners.

The display panel 200 is configured to display images. The display panel 200 may be a light-receiving type (i.e., non-emissive-type) display panel such as a liquid crystal display ("LCD") panel, an electrowetting display panel, an electrophoretic display ("EPD") panel, a microelectromechanical system ("MEMS") display panel, and the like. Hereinafter, an exemplary embodiment where the display panel 200 is an LCD panel will be described in detail, but the invention is not limited thereto.

The display panel 200 may have a quadrangular plate shape having two pairs of parallel sides. According to an exemplary embodiment, the display panel 200 may have a rectangular shape having a pair of relatively long sides and a pair of relatively short sides. The display panel 200 includes a first substrate 210, a second substrate 220 opposite to, e.g., facing, the first substrate 210, and a liquid crystal layer 230 interposed between the first and second substrates 210 and 220. The display panel 200, in a top plan view, includes a display area in which an image is displayed and a non-display area which surrounds the display area and in which an image is not displayed. The non-display area may be covered by the upper frame 100.

In an exemplary embodiment, the first substrate 210 may include a plurality of pixel electrodes (not illustrated) and a plurality of thin film transistors ("TFT", not illustrated) electrically connected to the pixel electrodes in one-to-one correspondence. Each of the TFTs includes a source electrode connected to a data line, a gate electrode connected to a gate line, and a drain electrode connected to the pixel electrode. Each of the TFTs functions as a switch of a driving signal that is supplied to a corresponding one of the pixel electrodes. In such an embodiment, the second substrate 220 may include a common electrode (not illustrated) for forming an electric field that controls the alignment of liquid crystals, along with the pixel electrodes. The display panel 200 is configured to drive the liquid crystal layer 230 to display an image frontwards.

The display panel 200 includes a driving chip (not illustrated) configured to supply a driving signal, a driving-chip mounting film (not illustrated) on which the driving chip is mounted, and a printed circuit board ("PCB", not illustrated) electrically connected to the display panel 200 through the driving-chip mounting film. The driving-chip mounting film may be a tape carrier package ("TCP").

A polarizer 240 is disposed on the display panel 200, and includes a first polarizer 241 and a second polarizer 242. In an exemplary embodiment, the first and second polarizers 241 and 242 are disposed on respective surfaces of the first and second substrates 210 and 220 that are opposite to respective surfaces of the first and second substrates 210 and 220 facing one another. In such an embodiment, the first polarizer 241 may be attached to an outer side of the first substrate 210 and the second polarizer 242 may be attached to an outer side of the second substrate 220. A transmission axis of the first polarizer 241 may be substantially perpendicular with respect to a transmission axis of the second polarizer 242.

The intermediate frame 300 is coupled to the lower frame 440 and accommodates the display panel 200 therein. The intermediate frame 300 may include a flexible material, such as plastic, to reduce or effectively prevent damage to the display panel 200.

A portion of the intermediate frame 300 is elongated inwardly along an edge of the display panel 200 and supports the display panel 200 from therebelow. The elongated portion of the intermediate frame 300 may be provided to correspond to four sides or at least one of the four sides of the display panel 200. In one exemplary embodiment, for example, the intermediate frame 300 may have a quadrilateral-loop shape corresponding to the four sides of the display panel 200, or may have a "[" shape, that is, a quadrilateral open-loop shape corresponding to three of the four sides of the display panel 200.

The backlight unit 400 includes an optical sheet 410, a light guide plate 420, a reflective sheet 430, the lower frame 440, a light source unit 450 and a light converting member 460.

The light source unit 450 includes a light source 451 and a circuit board 452 on which the light source 451 is disposed. The light source unit 450 may be disposed at a corner portion or on a light-incident side surface of the light guide plate 420. In such an embodiment, the light source unit 450 may emit light toward the corner portion or the light-incident side surface of the light guide plate 420.

The light source 451 may include a light emitting diode ("LED") package. The light source 451 may include a light emitting surface in a direction in which the light guide plate 420 is disposed. Light emitted from the light source 451 may be blue light.

The circuit board 452 may include, for example, a PCB or a metal printed circuit board ("MPCB").

The light source unit 450 may be provided or disposed on one, two, or four side surfaces of the light guide plate 420, based on a size, luminance, uniformity, and the like, of the display panel 200. In an alternative exemplary embodiment, the light source unit 450 may be disposed at one or more of the corner portions of the light guide plate 420.

The light guide plate 420 receives the light emitted from the light source 451 incident on the light-incident side surface of the light guide plate 420, and emits the light toward a light dissipating surface of the light guide plate 420. The light guide plate 420 is configured to uniformly supply, to the display panel 200, the light supplied from the light source unit 450. The light guide plate 420 is disposed adjacent to the light source unit 450 and is accommodated in the lower frame 440. The light guide plate 420 may have, for example, a quadrangular plate shape similar to the shape of the display panel 200, but the shape of the light guide plate 420 is not limited thereto. In an alternative exemplary embodiment in which an LED is used as the light source 451, the light guide plate 420 may have various shapes including such as, for example, a predetermined groove and/or a protrusion based on a position of the light source 451.

In such an embodiment, as described above, the light guide plate 420 may have a plate shape, that is, a plate such as having a relatively large cross-sectional thickness for ease of description, but not being limited thereto. In an alternative exemplary embodiment, the light guide plate 420 may be in a sheet or film shape of which the cross-sectional thickness is smaller than that of the plate to achieve slimness of the display device. The light guide plate 420 is to be understood as having a concept that includes not only a plate but also a film which guides the light supplied from the light source unit 450.

The light guide plate 420 may include a light-transmissive material. The light-transmissive material may include polycarbonate ("PC") or an acrylic resin such as poly(methyl methacrylate) ("PMMA") to improve guide light efficiency.

A pattern may be disposed on or defined in at least a surface of the light guide plate 420. In an exemplary embodiment, for example, a scattering pattern (not illustrated) may be disposed or defined to allow light guided to a lower surface of the light guide plate 420 to be emitted upwardly thereof.

The optical sheet 410 is disposed above the light guide plate 420, and diffuses and/or collimates light transmitted from the light guide plate 420. The optical sheet 410 may collectively include a diffusion sheet, a prism sheet, a protective sheet, and the like.

The diffusion sheet may disperse light incident thereto from the light guide plate 420 to thereby reduce or effectively prevent the partial concentration of the light.

The prism sheet may include trigonal prisms arranged on a surface thereof in a predetermined manner. In such an exemplary embodiment, the prism sheet may be disposed on the diffusion sheet to collimate the light diffused from the diffusion sheet in a direction perpendicular to the display panel 200.

The protective sheet may be disposed on the prism sheet, may protect a surface of the prism sheet, and may diffuse light to achieve uniform light distribution.

The reflective sheet 430 is disposed between the light guide plate 420 and the lower frame 440, and reflects light emitted downwardly from the light guide plate 420 to be re-directed toward the display panel 200, thereby improving light efficiency.

The reflective sheet 430 may include, for example, polyethylene terephthalate ("PET"), and thus may have reflectivity. A surface of the reflective sheet 430 may be coated with a diffusion layer including, for example, titanium dioxide ($TiO_2$).

In an alternative exemplary embodiment, the reflective sheet 430 may include a material including a metal, such as silver (Ag).

The lower frame 440 accommodates the reflective sheet 430 and the light guide plate 420 therein. The lower frame 440 may include metal having rigidity, such as stainless steel, or a material having a relatively high heat dissipation property, such as aluminum (Al) or an Al alloy. In such an embodiment, the lower frame 440 maintains an overall framework of the display device and protects various components to be accommodated therein.

Hereinafter, an exemplary embodiment of the light source 451 and the light converting member 460 will be described in greater detail with reference to FIGS. 2 to 13.

Figure 3A:
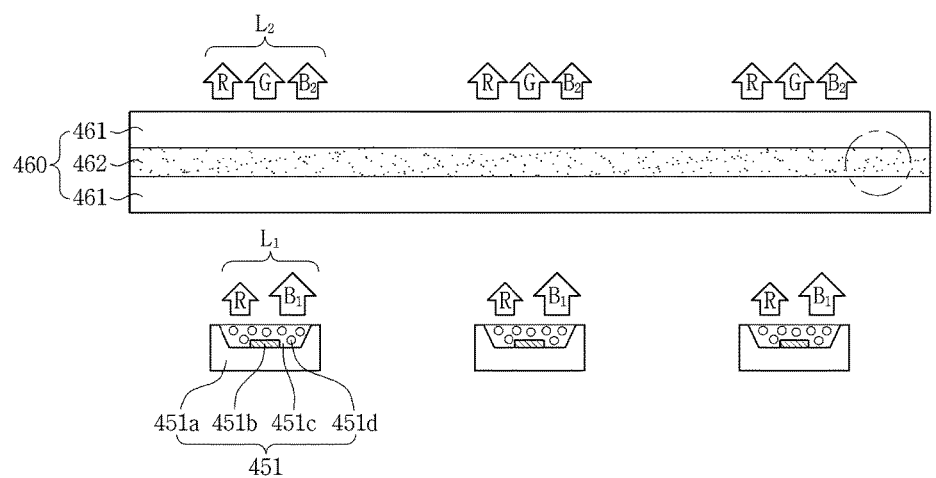
FIG. 3A is a schematic cross-sectional view illustrating a light converting member and a light source of FIG. 1.
Figure 3B:
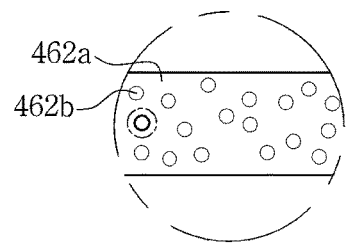
FIG. 3B is an enlarged view of the encircled portion of FIG. 3A.
Figure 3C:
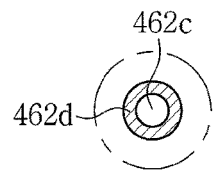
FIG. 3C is an enlarged view of the encircled portion of FIG. 3B.

FIG. 3A is a schematic cross-sectional view illustrating the light converting member 460 and the light source 451 of FIG. 1, FIG. 3B is an enlarged view of the encircled portion of FIG. 3A, and FIG. 3C is an enlarged view of the encircled portion of FIG. 3B.

Referring to FIGS. 2 and 3A to 3C, in an exemplary embodiment, the light source 451 includes an LED package. The light source 451 includes a mold 451a, an LED 451b, a resin 451c, and red phosphors 451d. As used herein, light emitted from the light source 451 will be referred to as a first light L1, and light emitted from the light converting member 460 will be referred to as a second light L2, for ease of description. In addition, blue light from among the light emitted from the light source 451 will be referred to as a first blue light B1, and blue light from among the light emitted from the light converting member 460 will be referred to as a second blue light B2.

An accommodation space, in which the LED 451b is accommodated, is defined in the mold 451a, and the mold 451a has an open top. The mold 451a may include an insulating material. In an exemplary embodiment, for example, the mold 451a may include plastic such as polyphthalamide ("PPA").

The LED 451b is accommodated in the accommodation space of the mold 451a, and emits light in a wavelength range of about 400 nanometers (nm) to about 500 nm. The light in the wavelength range of about 400 nm to about 500 nm corresponds to blue light. When ultraviolet ("UV") light generally has a wavelength less than about 400 nm, blue light may have a wavelength in a range of about 400 nm to about 500 nm.

The resin 451c is disposed on the LED 451b, and includes the red phosphors 451d dispersed therein. In an exemplary embodiment, for example, the resin 451c is disposed in the accommodation space of the mold 451a to encapsulate the LED 451b. The resin 451c may include an insulating material, and the insulating material may include a light-transmissive material such as, for example, a silicone resin and an epoxy resin. Accordingly, the blue light generated from the LED 451b may be transmitted through the resin 451c to be emitted externally from the light source 451, and/or may be supplied to the red phosphors 451d dispersed in the resin 451c.

The red phosphors 451d are dispersed in the resin 451c, receive a portion of the blue light emitted from the LED 451b, and generate light in a wavelength range of about 580 nm to about 670 nm, which is different from the wavelength of the blue light. The light in the wavelength range of about 580 nm to about 670 nm corresponds to a red light R. The red phosphor 451d may include a red inorganic phosphor.

In one exemplary embodiment, for example, the red phosphor 451d may include at least one selected from a nitride-based red phosphor, a fluoride-based red phosphor, a silicate-based red phosphor, a sulfide-based red phosphor, a selenide-based red phosphor, an oxynitride-based red phosphor, a molybdate-based red phosphor, a tantalate-based red phosphor, carbide-nitride, a tungstate-based red phosphor, $Sr_2MgAl_{22}O_{36}:Mn^{4+}$, $(Ba, Sr, Ca)_2MgAl_{16}O_{27}:Eu^{2+}$, $(Ba, Sr, Ca)_2MgAl_{16}O_{27}:Mn^{2+}$, $Sr_4Al_{14}O_{25}:Eu^{2+}$, and $Mg_4O_{5.5}GeF:Mn^{4+}$.

In such an embodiment, the nitride-based red phosphor may include at least one selected from $(Sr, Ca)AlSiN_3:Eu$, $(Sr, Ca)AlSi(ON)_3:Eu$, $(Sr, Ca)_2Si_5N_8:Eu$, $(Sr, Ca)_2Si_5(ON)_8:Eu$, $(Sr, Ba)SiAl_4N_7:Eu$, $CaAlSiN_3:Eu^{2+}$, $(Sr, Ca)AlSiN_3:Eu^{2+}$, and $Sr_2Si_5N_8:Eu2$. The fluoride-based red phosphor may include at least one selected from $K_2SiF_6:Mn^{4+}$, $K_2TiF_6:Mn^{4+}$, $ZnSiF_6:Mn^{4+}$, $Na_2SiF_6:Mn^{4+}$, and $Mg_4O_5GeF:Mn^{4+}$. The molybdate-based red phosphor may include at least one selected from $LiLa_1-xEuxMo_2O_8$ and $LiEuMo_2O_8$. The tantalate-based red phosphor may include $K(Gd, Lu, Y)Ta_2O_7:Eu^{3+}$. The carbide-nitride may include $Cs(Y, La, Gd)Si(CN_2)_4:Eu$. The tungstate-based red phosphor may include at least one selected from $Gd_2WO_6:Eu^{3+}$, $Gd_2W_2O_9:Eu^{3+}$, $(Gd, La)_2W_3O_{12}:Eu^{3+}$, $La_2W_3O_{12}:Eu^{3+}$, $La_2W_3O_{12}:Sm^{3+}$, and $LiLaW_2O_8:Eu^{3+}$.

Figure 4:
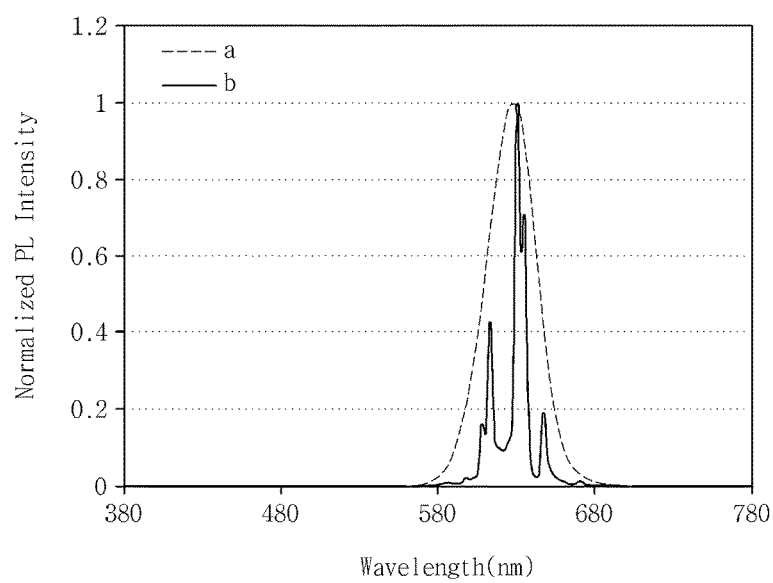
FIG. 4 is a graph illustrating respective light emission spectra of conventional red quantum dots and red inorganic phosphors.
Figure 5:
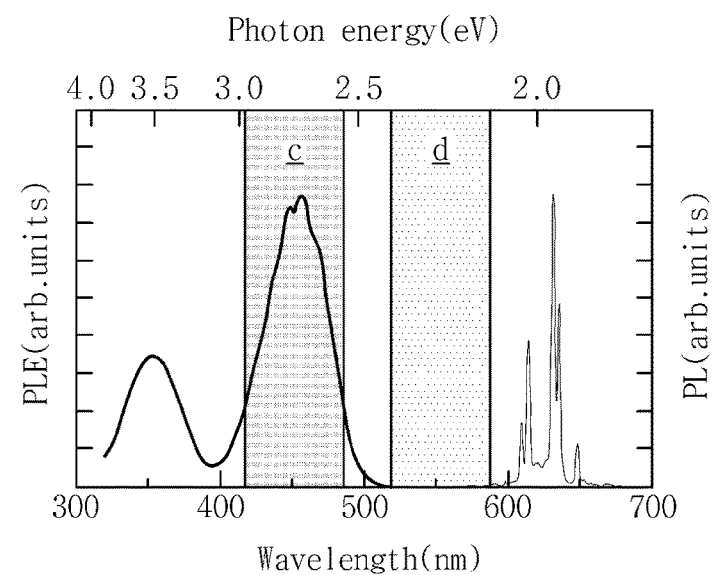
FIG. 5 is a graph illustrating an excitation spectrum of red inorganic phosphors.

FIG. 4 is a graph illustrating respective light emission spectra "a" and "b" of a conventional red quantum dot and a red inorganic phosphor. FIG. 5 is a graph illustrating an excitation spectrum of a red inorganic phosphor.

Referring to FIG. 4, in a comparison between the light emission spectrum "a" of a conventional red quantum dot and the light emission spectrum "b" of a red phosphor, a full width at half maximum ("FWHM") of the light emission spectrum "b" of the red phosphor is less than that of the light emission spectrum "a" of the conventional red quantum dot. Accordingly, it may be appreciated that a color purity of a red light that has been transmitted through the red phosphor is greater than or equal to that of a red light that has been transmitted through the conventional red quantum dot. The red phosphor of FIG. 4 may be a red inorganic phosphor including, for example, $K_2SiF_6:Mn^{4+}$ (may be also referred to as KSF).

In addition, based on the International Commission on Illumination ("CIE") 1931 chromaticity diagram, chromaticity coordinates of the conventional red quantum dot include an x coordinate of 0.68 and a y coordinate of 0.319, and chromaticity coordinates of the red inorganic phosphor including $K_2SiF_6:Mn^{4+}$ include an x coordinate of 0.702 and a y coordinate of 0.311. As such, the red inorganic phosphor including $K_2SiF_6:Mn^{4+}$ has a wider color gamut than that of the conventional red quantum dot. As a result, through the use of the red inorganic phosphor including $K_2SiF_6:Mn^{4+}$ and the like, the display device may achieve the reliability of red light and may realize ultra-high color reproducibility.

As illustrated in FIG. 5, the red inorganic phosphor including $K_2SiF_6:Mn^{4+}$ absorbs a blue light "c" in the wavelength range of about 400 nm to about 500 nm, and allows a green light "d" in a wavelength range of about 500 nm to about 580 nm to be transmitted therethrough as the green light "d". Accordingly, it may be appreciated that the red inorganic phosphor has the same effects as those of the conventional red quantum dot.

With the configuration of the light source 451 as described hereinabove, the light source 451 emits the first light L1 including the first blue light B1 and the red light R toward the light converting member 460. In such an embodiment, as the red phosphors 451d are dispersed in the resin 451c, a portion of the blue light emitted from the LED 451b is converted into the red light R and a remaining portion of the blue light is emitted toward the light converting member 460. As illustrated in FIG. 3A, the remaining portion of the blue light corresponds to the first blue light B1.

Hereinafter, a content of the red phosphors 451d dispersed in the resin 451c and a light amount ratio of the first blue light B1 to the red light R will be described with reference to Table 1, FIGS. 6 and 7.

Figure 6:
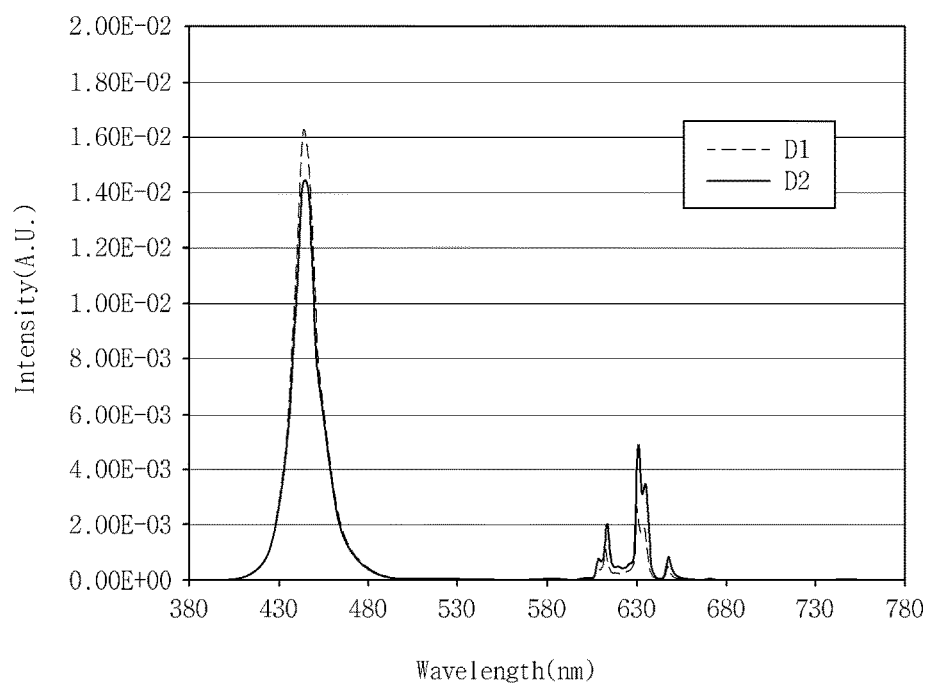
FIG. 6 is a graph illustrating light emission spectra of the light source of FIG. 3A.

FIG. 6 is a graph illustrating light emission spectra of the light source 451 of FIG. 3A. FIG. 7 is a graph illustrating respective amounts of the first blue light B1 and the red light R of the light source 451 of FIG. 3A.

light B1 of the light emission spectrum D1 and has the red light R having a higher intensity than an intensity of the red light R of the light emission spectrum D1. In addition, as illustrated in FIG. 7, as the content of the red phosphors 451d increases, the amount of the red light R increases and the amount of the first blue light B1 decreases.

Accordingly, the content of the red phosphors 451d may be appropriately determined based on the purpose of use of the display device. Based on chromaticity coordinates desired in a conventional display device, the content of the red phosphors 451d dispersed in the resin 451d may be in a range of about 2 wt % to about 30 wt %.

In addition, based on the content range of the red phosphors 451d, the light source 451 emits the light in the wavelength range of about 580 nm to about 670 nm and the light in the wavelength range of about 400 nm to about 500 nm at a light amount ratio in a range of about 1:1.8 to about 1:29.5. In other words, the light source 451 emits the red light R and the first blue light B1 at the light amount ratio in the range of about 1:1.8 to about 1:29.5.

In one exemplary embodiment, for example, in a case in which chromaticity coordinates desired in the display device are (0.313, 0.329) based on white light, a suitable content of the red phosphors 451d may be about 14 wt %. In such an embodiment, where the content of the red phosphors 451d is about 14 wt %, a light amount ratio of the red light R to the first blue light B1 may be about 1:5.2.

Based on the content range of the red phosphors 451d, chromaticity coordinates of the first light L1 emitted from the light source 451 include an x coordinate in a range of about 0.1654 to about 0.255 and a y coordinate in a range of about 0.0258 to about 0.0734.

Referring back to FIGS. 2 and 3A, the light converting member 460 converts a portion of the first blue light B1 supplied from the light source unit 450 into light in the wavelength range of about 500 nm to about 580 nm, and emits the converted light to the display panel 200. The light in the wavelength range of about 500 nm to about 580 nm corresponds to a green light G. In such an exemplary embodiment, the red light R supplied from the light source 451 is transmitted, as is, through the light converting mem-

TABLE 1

|  |  | Content of Red Phosphors | | | | | |
|---|---|---|---|---|---|---|---|
|  |  | 0 | 2 wt % | 6 wt % | 8 wt % | 14 wt % | 30 wt % |
| Chromaticity | CIE x | 0.157 | 0.1654 | 0.180 | 0.186 | 0.203 | 0.255 |
| Coordinates | CIE y | 0.022 | 0.0258 | 0.033 | 0.036 | 0.046 | 0.0734 |
| Amount of First Blue Light | | 3.65E−01 | 0.3543 | 3.38E−01 | 3.22E−01 | 3.01E−01 | 0.2255 |
| Amount of Red Light | | 4.70E−04 | 0.012 | 3.09E−02 | 3.80E−02 | 5.82E−02 | 0.124 |
| Blue/Red Ratio | | — | 29.5 | 10.9 | 8.5 | 5.2 | 1.8 |

Figure 7:
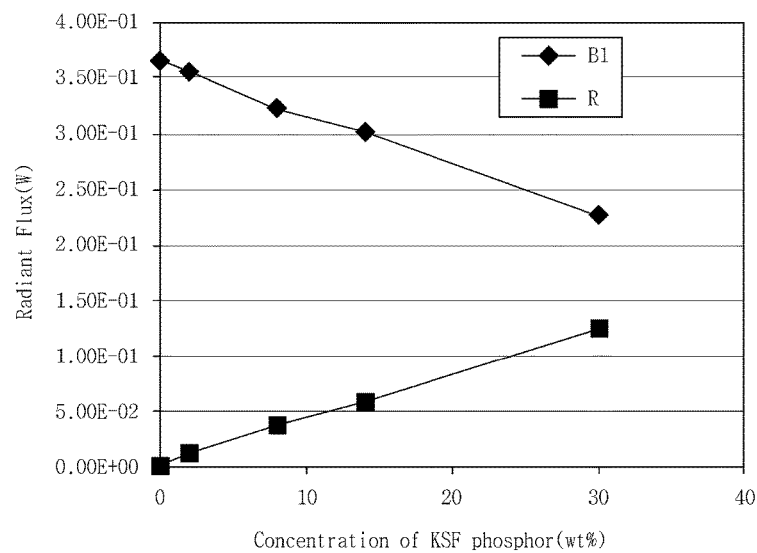
FIG. 7 is a graph illustrating respective amounts of a first blue light and a red light of the light source of FIG. 3A.

Referring to Table 1, and FIGS. 6 and 7, it may be appreciated from FIGS. 6 and 7 that as the content of the red phosphors 451d increases with respect to a content of the resin 451c, an intensity and an amount of the red light R increase and an intensity and an amount of the first blue light B1 decrease. In a comparison between light emission spectra illustrated in FIG. 6, for example, a light emission spectrum D1 of a light source 451 in which a content of the red phosphors 451d is about 6 percent by weight (wt %) and a light emission spectrum D2 of a light source 451 in which a content of the red phosphors 451d is about 14 wt %, the light emission spectrum D2 in which the content of the red phosphors 451d is about 14 wt % has the first blue light B1 having a lower intensity than an intensity of the first blue ber 460, and a second blue light B2 corresponding to a portion of the first blue light B1 is transmitted, as is, through the light converting member 460. Accordingly, the display panel 200 receives, from the light converting member 460, the second light L2 in which the second blue light B2, the red light R and the green light G are mixed. The second light L2 is white light.

The light converting member 460 is disposed between the light guide plate 420 and the display panel 200 to convert the first light L1 emitted from the light source 451 into the second light L2. In such an exemplary embodiment, the light converting member 460 is disposed between the light guide plate 420 and the optical sheet 410.

The light converting member 460 includes protective layers 461 and a light converting layer 462 disposed between the protective layers 461. The protective layer 461 may seal the light converting layer 462 to protect the light converting layer 462 from external gas, and the like. The protective layer 461 may include a transparent material including at least one of glass, plastic and a resin, for example.

The light converting layer 462 includes a polymer resin 462a and green quantum dots 462b dispersed in the polymer resin 462a. In such an embodiment, the light converting layer 462 only includes the green quantum dot 462b which converts the first light L1 emitted from the light source 451 into the green light G, absent a red quantum dot (not illustrated).

The polymer resin 462a may include an insulating polymer, and the insulating polymer may include, for example, a silicone resin, an epoxy resin, or an acrylic resin.

The green quantum dot 462b is a type of quantum dots. Hereinafter, a conventional quantum dot will be described. A quantum dot typically has a spherical shape having a diameter in a range of about a few to tens of nanometers, or hundreds of nanometers. In addition, a quantum dot may be a kind of nanomaterials, and may include a core including a material that has a relatively small band gap, an outer shell surrounding the core and including a material that has a relatively great band gap, and a ligand (not illustrated) attached to the outer shell.

Such nano-sized quantum dots exhibit quantum confinement effects. One of the primary characteristics of quantum confinement effects may include a relatively great band gap, and a discontinuous band gap structure similarly to that of a single individual atom unlike grains of bulk. A quantum dot may adjust an interval between discontinuous band gaps based on a size (e.g., diameter) of the quantum dot. Accordingly, when quantum dots are synthesized to have a uniform size distribution, a light converting material having a spectral distribution with a relatively narrow full width at half maximum ("FWHM") may be obtained. For example, as a size (e.g., diameter) of a quantum dot increases, a wavelength of light being generated may increase. In this regard, a wavelength of light being emitted may be controlled or tuned by adjusting a size of a quantum dot.

A quantum dot absorbs light emitted from the light guide plate 420, and emits light having a wavelength corresponding to a band gap of the quantum dot.

In detail, when it is assumed that light emitted from the light source 451 is a third light and light emitted from the quantum dot is a fourth light, a wavelength of the third light is less than or equal to a wavelength of the fourth light. This is because of the law of conservation of energy, and in accordance therewith, the quantum dot may not emit light having greater energy than energy of the light absorbed by the quantum dot. Accordingly, the wavelength of the fourth light may be greater than or equal to the wavelength of the third light. For example, in a case of a quantum dot having a relatively small diameter, a wavelength of light being emitted from the quantum dot decreases to generate bluish light. When a quantum dot has a relatively great diameter, a wavelength of light being emitted from the quantum dot increases to generate reddish light.

The quantum dot may include Group II-VI semiconductor compounds such as zinc sulfide (ZnS), zinc selenide (ZnSe), zinc telluride (ZnTe), cadmium sulfide (CdS), cadmium selenide (CdSe), cadmium telluride (CdTe), mercury sulfide (HgS), mercury selenide (HgSe), and mercury telluride (HgTe), and/or Group III-V semiconductor compounds such as lead sulfide (PbS), lead selenide (PbSe), lead telluride (PbTe), aluminum nitride (AlN), aluminum phosphide (AlP), aluminum arsenide (AlAs), aluminum antimony (AlSb), gallium, nitride (GaN), gallium arsenide (GaAs), gallium antimony (GaSb), indium nitride (InN), indium phosphide (InP), indium arsenide (InAs), indium antimony (InSb), indium gallium phosphide (InGaP), or indium zinc phosphide (InZnP).

The green quantum dot 462b may have a spherical shape having a diameter in a range of about a few to tens of nanometers, or hundreds of nanometers. The green quantum dot 462b may have a diameter in a range suitable for generating green light. In an exemplary embodiment, for example, the diameter of the green quantum dot 462b may be in a range of about 3 nm to about 5 nm. In an alternative exemplary embodiment, the green quantum dot 462b may have a diameter set to allow a wavelength of light incident thereto to be converted into a wavelength of green light, in addition to the diameter in the above range. Further, the green quantum dot 462b may be a kind of nanomaterials, and may include a core 462c including a material that has a relatively small band gap, an outer shell 462d surrounding the core 462c and including a material that has a relatively great band gap, and a ligand (not illustrated) attached to the outer shell 462d. In an exemplary embodiment, for example, the core 462c includes at least one selected from CdSe, CdTe, CdS, InP, InGaP, and InZnP. The outer shell 462d includes at least one selected from CdSe, ZnS, and ZnSe.

The green quantum dot 462b may include at least one selected from a phosphor based on manganese (Mn)-doped zinc silicon oxide, for example, $Zn_2SiO_4$:Mn, a phosphor based on europium (Eu)-doped strontium gallium sulfide, for example, $SrGa_2S_4$:Eu, and a phosphor based on Eu-doped barium silicon oxide chloride, for example, $Ba_5Si_2O_7Cl_4$:Eu.

Even after being transmitted through the green quantum dot 462b, the red light R is emitted as the red light R. In other words, since the green quantum dot 462b converts light having a wavelength at least less than the wavelength of the green light G into the green light G, the red light R is emitted as the red light R even after being transmitted through the green quantum dot 462b. As described above, a quantum dot has a predetermined band gap based on a size (e.g., diameter) of the quantum dot. Thus, when light having a relatively long wavelength, which is greater than a predetermined wavelength, is incident to the quantum dot, the quantum dot allows the incident light to be transmitted therethrough without converting the wavelength of the incident light.

Hereinafter, a light amount ratio of the first blue light B1 to the second blue light B2 and a light amount ratio of the green light G and the second blue light B2 based on a content of the green quantum dots 462b will be described with reference to Table 2 and FIG. 8.

Figure 8:
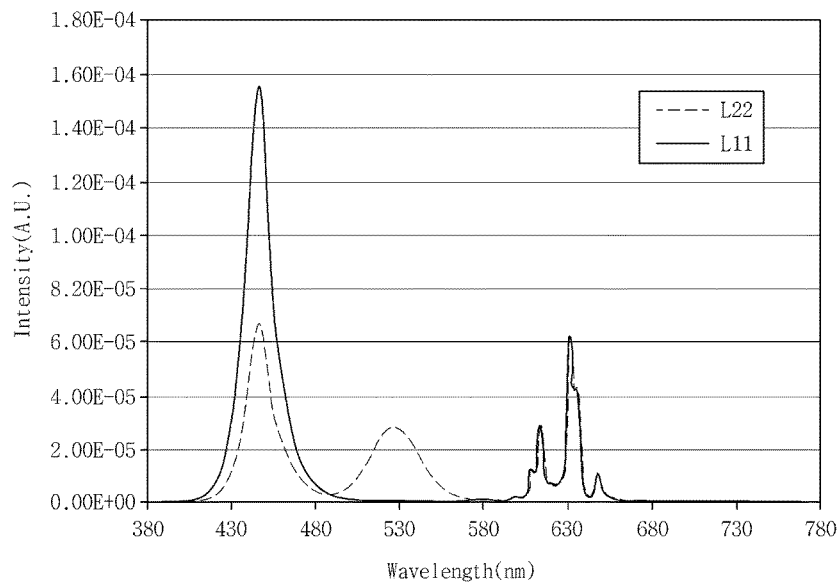
FIG. 8 is a graph illustrating respective amounts of the first blue light and a second blue light of FIG. 3A.

FIG. 8 is a graph illustrating respective amounts of the first blue light B1 and the second blue light B2 of FIG. 3A.

TABLE 2

|  | Content of Green Quantum dots | | | |
| --- | --- | --- | --- | --- |
|  | 100% | 70% | 40% | 20% |
| First Blue Light (B1) | 100 | 100 | 100 | 100 |
| Second Blue Light (B2) | 37 | 46 | 55 | 61 |
| Green Light (G) | 31 | 27 | 23 | 20 |
| B1/B2 | 2.7 | 2.2 | 1.8 | 1.6 |
| B2/G | 1.2 | 1.7 | 2.4 | 3.0 |

The content of the green quantum dots 462b shown in Table 2 is represented as a value relative to a reference value of 100% which is set to be a value equal to a content of conventional quantum dots including green quantum dots and red quantum dots, for ease of description. For example, it may be assumed that the content of the conventional quantum dots is 100% in a case in which a total number of the green and red quantum dots included in the conventional quantum dots of a conventional light converting member is 11. Accordingly, based on the above assumption, the content of the green quantum dots 462b included in the light converting member 460 of an exemplary embodiment shown in FIG. 3A may be represented as 100% in a case in which the light converting member 460 includes 11 green quantum dots 462b. The content of the green quantum dots 462b may vary based on the type, the purpose of use, and the like, of the display device. In this regard, the content of the green quantum dots 462b is represented as a relative value as described above.

Each value of the first blue light B1, the second blue light B2, and the green light G shown in Table 2 represents an amount of the light, and each amount of the second blue light B2 and the green light G has a value relative to a reference value of 100 which is set to be a value equal to the amount of the first blue light B1.

In Table 2, B1/B2 represents the light amount ratio of the first blue light B1 to the second blue light B2, and B2/G represents the light amount ratio of the second blue light B2 to the green light G.

As shown in Table 2, the amount of the second blue light B2 and the amount of the green light G vary based on the content of the green quantum dots 462b. In other words, the first blue light B1 is converted into the green light G in a case of being transmitted through the green quantum dots 462b, such that the respective amounts of the second blue light B2 and the green light G vary based on the content of the green quantum dots 462b. In an exemplary embodiment, the content of the green quantum dots 462b shown in FIG. 3B may be in a range of about 20% to about 100% to allow the light converting member 460 to provide white light.

Accordingly, based on the above content range of the green quantum dots 462b as shown in Table 2, a light amount ratio of the light emitted from the light source 451 and in the wavelength range of about 400 nm to about 500 nm to the light emitted from the light converting member 460 and in the wavelength range of about 400 nm to about 500 nm is in a range of about 1.6:1 to about 2.7:1. In an exemplary embodiment, the light amount ratio of the first blue light B1 to the second blue light B2 is in the range of about 1.6:1 to about 2.7:1.

FIG. 8 is a graph illustrating simulation results in a case in which the content of the green quantum dots 462b is about 70%. In a comparison between light emission spectra illustrated in FIG. 8, for example, a light emission spectrum L11 of the first light L1 of FIG. 3A and a light emission spectrum L22 of the second light L2 of FIG. 3A, the second light L2 has a less amount of blue light than an amount of blue light among the first light L, has the same amount of red light as an amount of red light among the first light L, and includes green light. When the amount of the first blue light B1 is defined as 100, the amount of the second blue light B2 may be about 46. Accordingly, a light amount ratio of the light emitted from the light source 451 and in the wavelength range of about 400 nm to about 500 nm with respect to the light emitted from the light converting member 460 and in the wavelength range of about 400 nm to about 500 nm is about 2.2:1. In other words, the light amount ratio of the first blue light B1 emitted from the light source 451 to the second blue light B2 emitted from the light converting member 460 is about 2.2:1, and such a ratio is within the aforementioned range of the light amount ratio of the first blue light B1 to the second blue light B2 shown in Table 2.

Accordingly, in an exemplary embodiment, the amount of the first blue light B1 emitted from the light source 451 is greater than the amount of the second blue light B2 emitted from the light converting member 460.

As shown in Table 2, the light converting member 460 emits the light in the wavelength range of about 500 nm to about 580 nm and the light in the wavelength range of about 400 nm to about 500 nm at a light amount ratio in a range of about 1:1.2 to about 1:3 based on the content of the green quantum dots 462b. In other words, the light amount ratio of the green light G to the second blue light B2 is in the range of about 1:1.2 to about 1:3.

In an exemplary embodiment, the display panel 200 may receive a white light with the configuration of the light source 451 and the light converting member 460 as described hereinabove. Hereinafter, a process of supplying the white light to the display panel 200 will be described with reference to FIGS. 3, 9, and 10.

Figure 9:
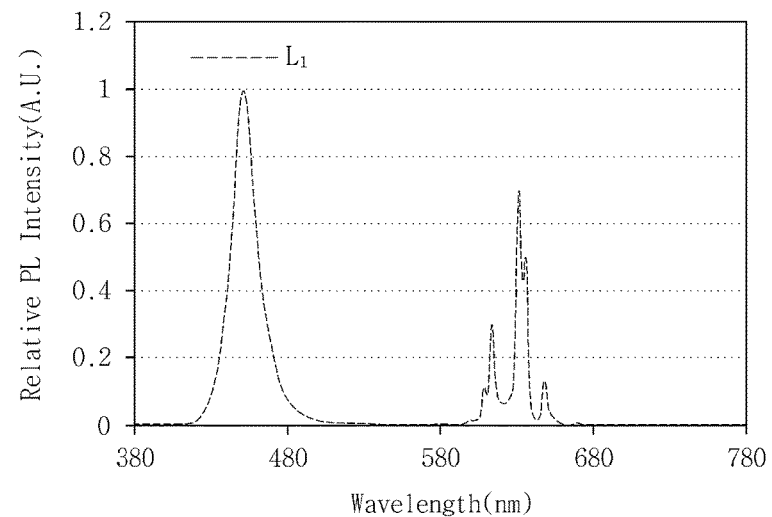
FIG. 9 is a graph illustrating a wavelength distribution of light emitted from the light source of FIG. 3A.
Figure 10:
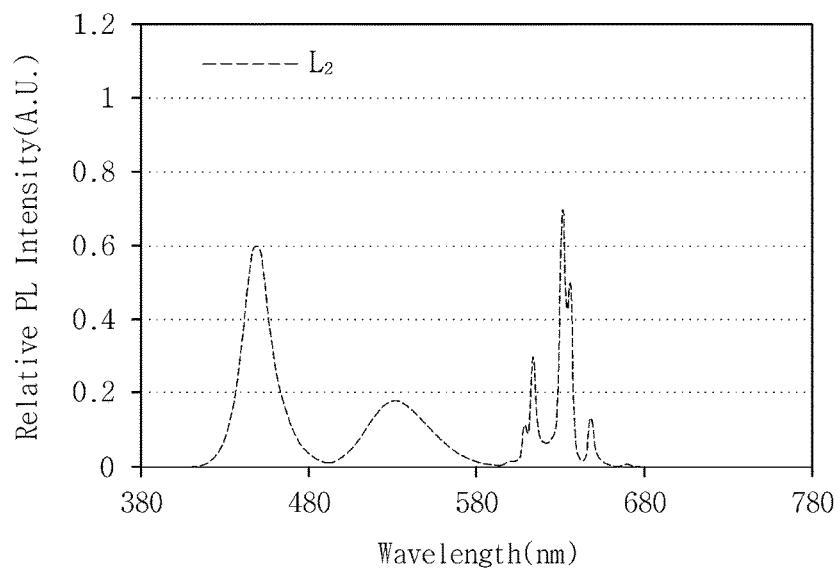
FIG. 10 is a graph illustrating a wavelength distribution of light emitted from the light converting member of FIG. 3A.

FIG. 9 is a graph illustrating a wavelength distribution of the first light L1 emitted from the light source 451 of FIG. 3A. FIG. 10 is a graph illustrating a wavelength distribution of the second light L2 emitted from the light converting member 460 of FIG. 3A.

The light source 451 receives a blue light from the LED 451b and emits the first light L1 including the first blue light B1 and the red light R. The first blue light B1 is a portion of the blue light that has been transmitted, as is, through the resin 451c, and may be in the wavelength range of about 400 nm to about 500 nm. The red light R is a converted portion of the blue light supplied from the LED 451b that has been transmitted through the red phosphors 451d, and may be in the wavelength range of about 580 nm to about 670 nm.

Referring to FIGS. 3 and 10, the light converting member 460 receives the first light L1 from the light source 451, and emits the second light L2 in which the red light R, the green light G and the second blue light B2 are mixed. The second light L2 corresponds to white light. The red light R is the red light R that is emitted from the light source 451 and has been transmitted, as is, through the light converting member 460, and may be in the wavelength range of about 580 nm to about 670 nm. The green light G is a converted portion of the first light L1 emitted from the light source 451 that has been transmitted through the green quantum dots 462b, and may be in the wavelength range of about 500 nm to about 580 nm. The second blue light B2 is a portion of the first blue light B1 that has been transmitted, as is, through the polymer resin 462a of the light converting layer 462, and may be in the wavelength range of about 400 nm to about 500 nm. Accordingly, the display panel 200 receives, from the light converting member 460, the second light L2 in which the second blue light B2, the red light R and the green light G are mixed.

Hereinafter, the effects of the display device according such an exemplary embodiment will be described with reference to FIGS. 11, 12, and 13.

Figure 11A:
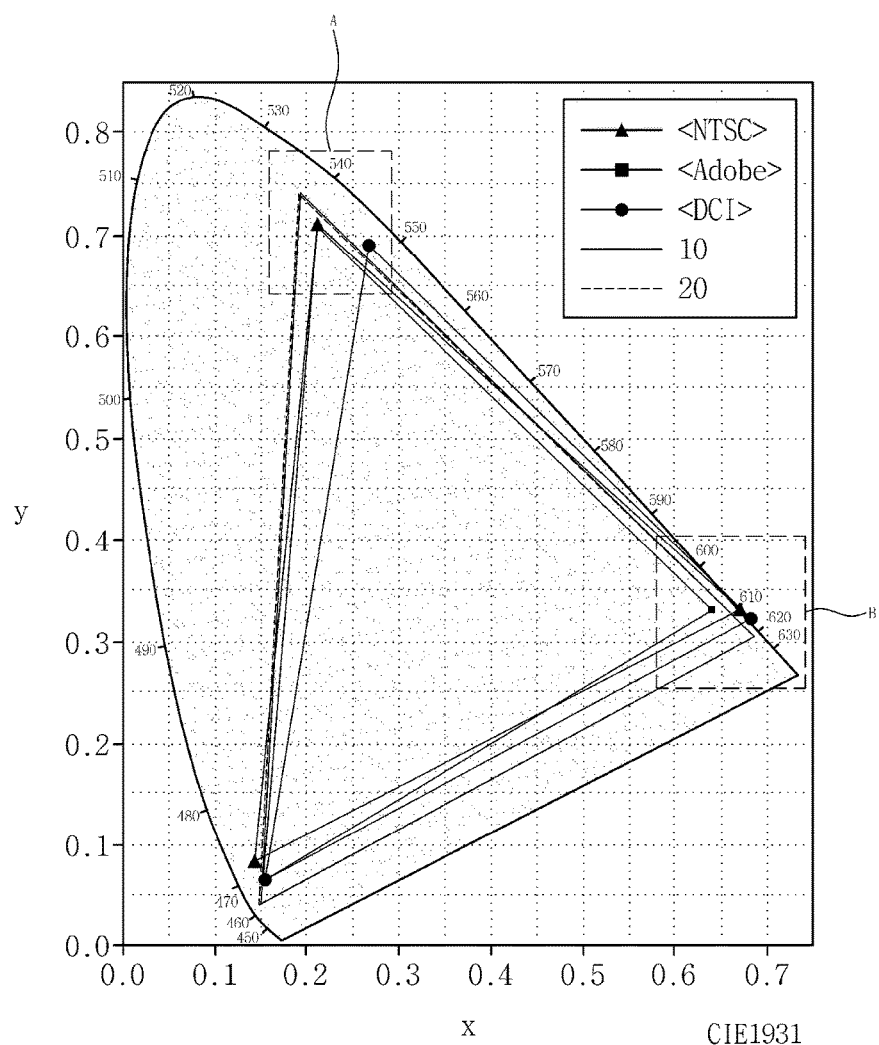
FIG. 11A is the International Commission on Illumination ("CIE") 1931 chromaticity diagram illustrating color spaces of images obtained from a conventional display device and the display device according to an exemplary embodiment.
Figure 11B:
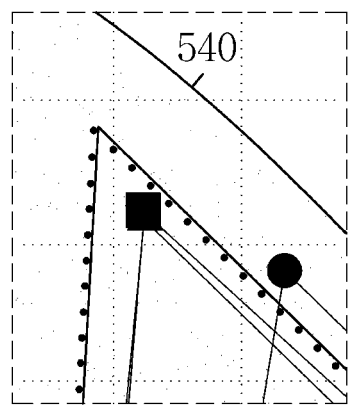
FIG. 11B is an enlarged view of the portion A in FIG. 11A.
Figure 11C:
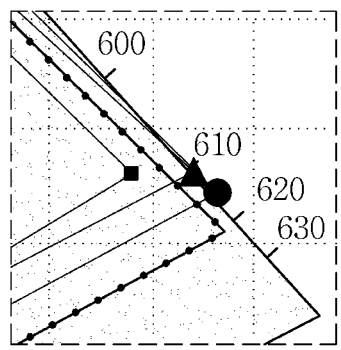
FIG. 11C is an enlarged view of the portion B in FIG. 11A.

FIG. 11A is the CIE 1931 chromaticity diagram illustrating color spaces of images obtained from a conventional display device and the display device according to an exemplary embodiment, FIG. 11B is an enlarged view of the portion A in FIG. 11A, and FIG. 11C is an enlarged view of the portion B in FIG. 11A.

TABLE 3

| | Conventional Display Device | Display Device according to Exemplary Embodiment |
|---|---|---|
| Percent of NTSC Coverage (CIE 1931) | 116% | 116% |
| Percent of Overlap with Adobe (CIE 1931) | 100% | 100% |
| Percent of Overlap with DCI | 98.2% | 98.2% |

Referring to Table 3 and FIGS. 11A to 11C, each of a National Television Standards Committee ("NTSC") color space, an Adobe color space, a Digital Cinema Initiatives ("DCI") color space, a color space 10 of the conventional display device, and a color space 20 of an exemplary embodiment the display device according to the invention is defined by chromaticity coordinates in the CIE 1931 chromaticity diagram of FIG. 11A. Respective inner areas of triangles defined by the chromaticity coordinates in the CIE 1931 chromaticity diagram correspond to the respective color spaces. The color space refers to a color area reproducible by each medium (i.e., color gamut) within a boundary of an entire solar light area which is defined by an outermost contour in the CIE 1931 chromaticity diagram. Accordingly, as the color space defined by the chromaticity coordinates is extended, a range of reproducible color may increase. In such an exemplary embodiment, the conventional display device includes a light converting member that includes both green quantum dots and red quantum dots.

In an exemplary embodiment, the color space 20 of an exemplary embodiment of the display device including the light converting member 460 shown in FIG. 3A overlaps significant portions of the NTSC color space, the Adobe color space, the DCI color space, and the color space 10 of the conventional display device, respectively. In such an embodiment, the display device including the light converting member 460 has a color gamut the same as that of the display device using the conventional light converting member, despite the omission of red quantum dots. In such an embodiment, the display device has a wider color gamut than that of a display device absent a light converting member including quantum dots.

Figure 12:
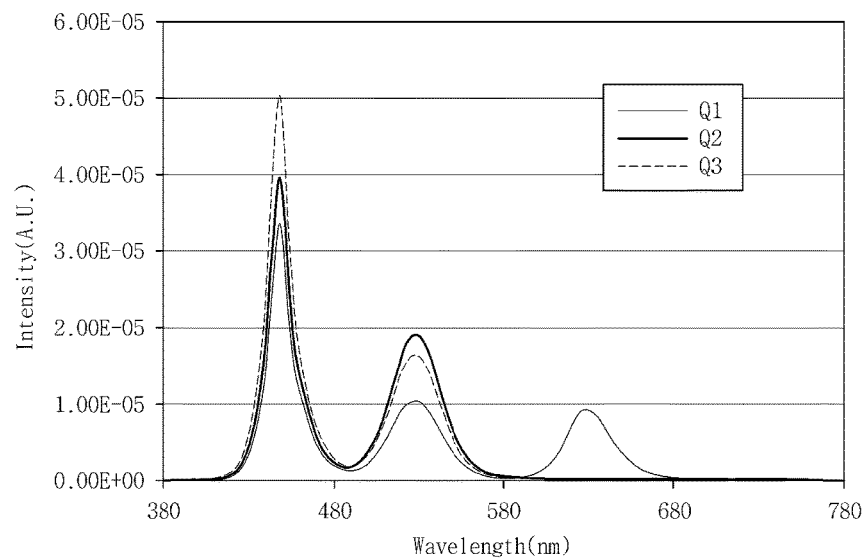
FIG. 12 is a graph illustrating an intensity of light emitted from a conventional light converting member and an intensity of the light emitted from the light converting member of FIG. 3A.

FIG. 12 is a graph illustrating an intensity of light emitted from a conventional light converting member and an intensity of the light emitted from the light converting member 460 of FIG. 3A.

TABLE 4

| | Conventional Display Device | Display Device according to Exemplary Embodiment | |
|---|---|---|---|
| Composition of Quantum Dots | Red and Green Quantum Dots | Green Quantum Dots | Green Quantum Dots |
| Content of Quantum Dots | 100 | 90.9 | 63.6 |
| Amount of Blue Light | 68 | 80 | 100 |
| Amount of Green Light | 38 | 68 | 59 |

Referring to FIGS. 4 and 12, a first light emission spectrum Q1 of the conventional display device using a light converting member including red quantum dots and green quantum dots, and a second light emission spectrum Q2 and a third light emission spectrum Q3 of an exemplary embodiment of the display device including the light converting member 460 of FIG. 3A are illustrated in FIG. 12. For ease of description, the content of the quantum dots shown in Table 4 is represented as a value relative to a reference value of 100 which is set to be a value equal to the content of conventional quantum dots including the green and red quantum dots. In addition, each amount of the blue light and the green light shown in Table 4 is represented as a value relative to a reference value of 100 which is set to be a value equal to an amount of blue light of the display device having the third light emission spectrum Q3.

In general, a content ratio of the green quantum dots to the red quantum dots included in the conventional light converting member is 10:1. Accordingly, due to the omission of red quantum dots in the light converting member 460 according to an exemplary embodiment, the content of the quantum dots included in the light converting member 460 according to an exemplary embodiment is about 90.9 with respect to a total content of the quantum dots included in the conventional light converting member. However, as illustrated in Table 3 and FIG. 12, in the case of omitting only the red quantum dots, an amount of green light significantly increases by about 77% and an amount of blue light merely increases by about 17%, with respect to an amount of green light in the conventional display device. Accordingly, to prevent such a drastic increase in the amount of green light, the content of the green quantum dots is reduced to about 63.6 with respect to the total content of the quantum dots included in the conventional light converting member. In the case of reducing the content of the green quantum dots, the amount of green light increases by about 54% with respect to the amount of green light of the conventional display device, and the amount of blue light increases by about 48% with respect to the amount of blue light of the conventional display device.

As such, in an exemplary embodiment of the display device, the content of the quantum dots being used may be reduced by about 40% at maximum, with respect to the content of the quantum dots used in the conventional display device. Accordingly, as the number of the quantum dots, which includes cadmium (Cd), decreases, an exemplary embodiment of the display device may reduce environmental pollution and adverse health effects. In such an embodiment, as the number of the quantum dots decreases, manufacturing costs may decrease.

The content of the green quantum dots may vary based on the composition of quantum dots, efficiency of quantum dots, the chromaticity diagram which represents the color performance when using the display device, and the like.

Figure 13:
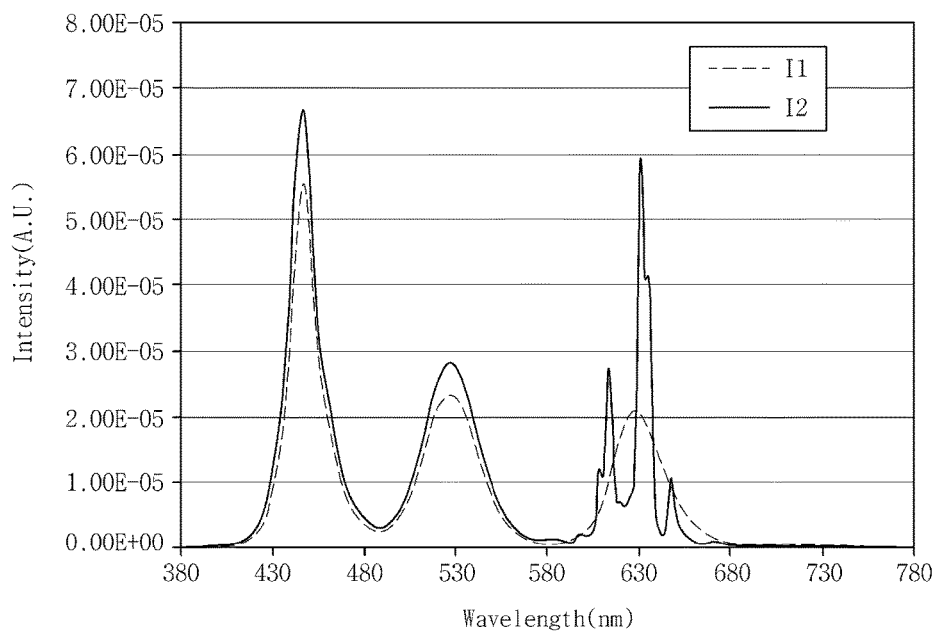
FIG. 13 is a graph illustrating a luminance of a display device using a conventional light converting member and a luminance of the display device of FIG. 1.

FIG. 13 is a graph illustrating a luminance I1 of a display device using a conventional light converting member and a luminance I2 of the display device of FIG. 1.

TABLE 5

| | Conventional Display Device | Display Device according to Exemplary Embodiment |
|---|---|---|
| Luminance of Display Panel | 325 nit | 399 nit |
| Chromaticity Coordinates of Display Panel (Adobe) | 0.313, 0.329 | 0.313, 0.329 |
| Power Consumption Amount of Backlight Unit | 37 W | 37 W |

Referring to FIG. 13 and Table 5, the luminance I2 of the display device according to an exemplary embodiment is higher than the luminance I1 of the conventional display device including green quantum dots and red quantum dots. As shown in FIG. 13 and Table 5, the luminance I2 of the display device according to an exemplary embodiment increases by about 23% as compared to the luminance I1 of the conventional display device. In addition, the chromaticity coordinates of the display device according to such an embodiment are the same as those of the conventional display device, and an amount of power consumed in the display device according to such an embodiment is the same as an amount of power consumed in the conventional display device. The chromaticity coordinates of the display panel shown in Table 5 correspond to the chromaticity coordinates of white light.

Hereinafter, alternative exemplary embodiment of the display device will be described with reference to FIGS. 14 to 24. A description of the configuration that is the same as that described in an exemplary embodiment described above will be omitted hereinafter for convenience of description.

Figure 14:
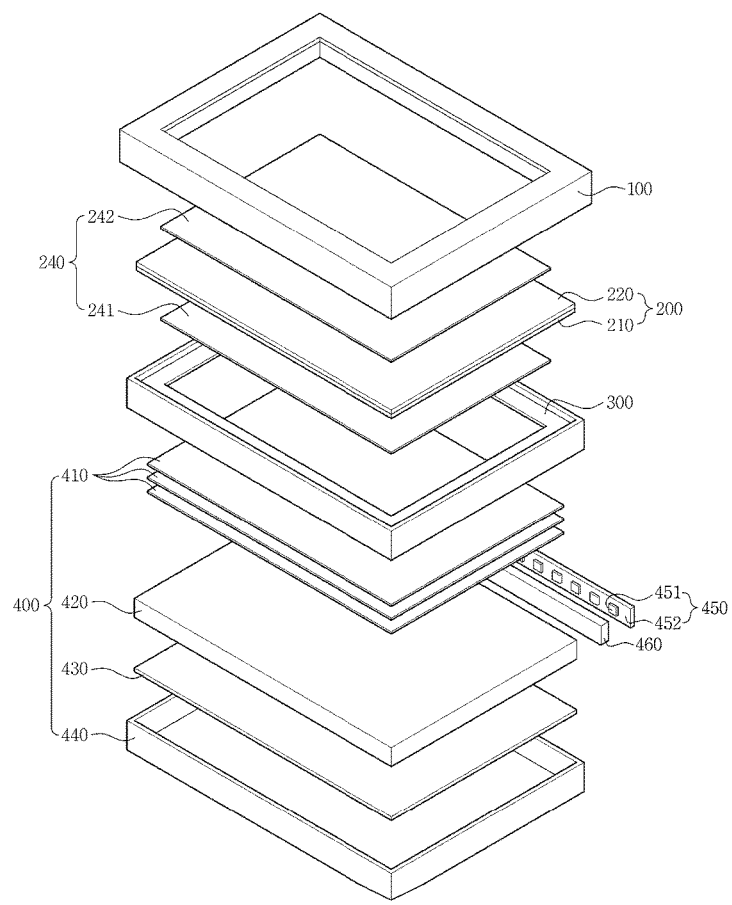
FIG. 14 is a schematic exploded perspective view illustrating a display device according to an alternative exemplary embodiment.
Figure 15:
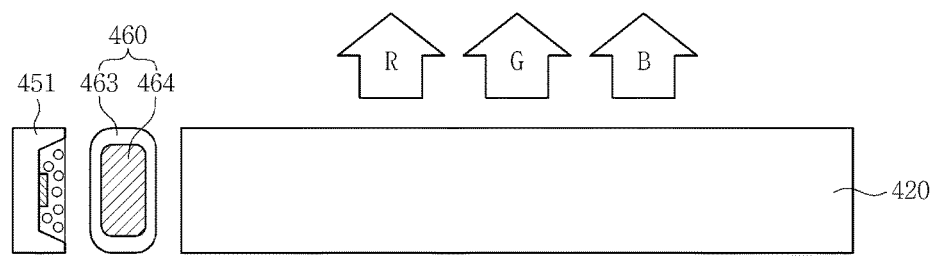
FIG. 15 is a cross-sectional view illustrating a light source, a light converting member, and a light guide plate of FIG. 14.

FIG. 14 is a schematic exploded perspective view illustrating the display device according to an alternative exemplary embodiment. FIG. 15 is a cross-sectional view illustrating a light source 451, a light converting member 460, and a light guide plate 420 of FIG. 14.

Referring to FIGS. 14 and 15, in such an embodiment, the light converting member 460 is disposed between the light guide plate 420 and a light source unit 450. The light converting member 460 includes a tube 463 having a bar shape that corresponds to the protective layer 461 shown in FIG. 3A. In one exemplary embodiment, for example, the light converting member 460 includes the tube 463 having an interior space, and a light converting material 464 in the tube 463.

The tube 463 may include a glass material and has the interior space. The tube 463 encapsulates the light converting material 464 therein. In an alternative exemplary embodiment, the tube 463 may have a bar shape or a linear shape.

The light converting material 464 has the same composition as that of the light converting layer 462 (see, e.g., FIG. 3A) of an exemplary embodiment described above with reference to FIGS. 1 to 13. The light converting material 464 includes a polymer resin and green quantum dots. In such an embodiment, the light source 451 has the same configuration as that of an exemplary embodiment described above with reference to FIGS. 1 to 13. Accordingly, light emitted from the light guide plate 420 corresponds to white light in which a red light R, a green light G and a blue light B are mixed. Accordingly, such an embodiment of the display device has the same effects as those in an exemplary embodiment described above with reference to FIGS. 1 to 13.

Figure 16:
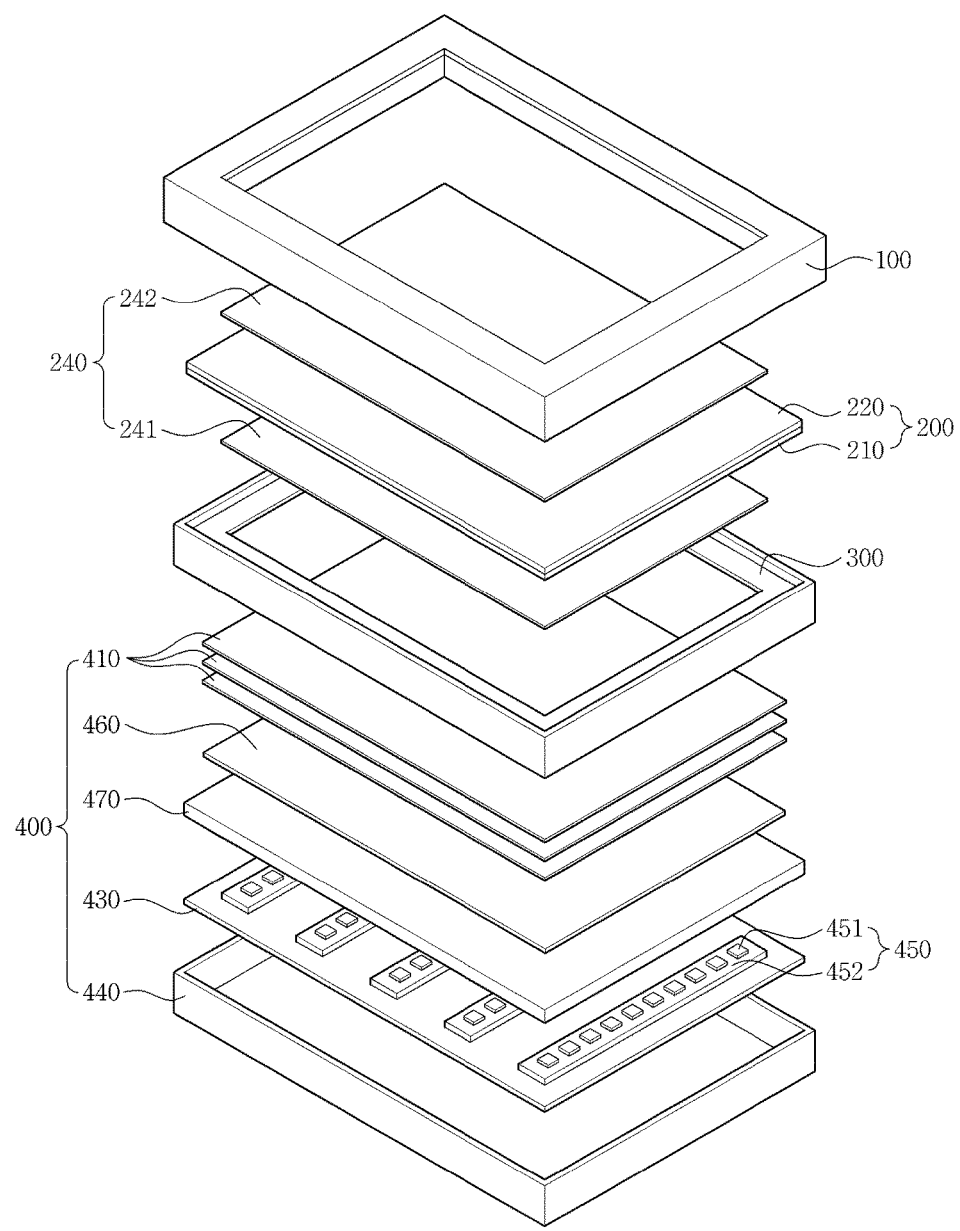
FIG. 16 is a schematic exploded perspective view illustrating a display device according to another alternative exemplary embodiment.

FIG. 16 is a schematic exploded perspective view illustrating the display device according to another alternative exemplary embodiment.

Referring to FIG. 16, an exemplary embodiment of the display device includes a direct-type backlight unit 400, in a manner dissimilar to that of an exemplary embodiment described above with reference to FIGS. 1 to 13. A light converting member 460 is disposed between a light source unit 450 and a display panel 200. The light source unit 450 is disposed below the light converting member 460. In such an embodiment, the backlight unit 400 includes a diffusion plate 470, in a manner dissimilar to that of an exemplary embodiment described above with reference to FIGS. 1 to 13.

Figure 17:
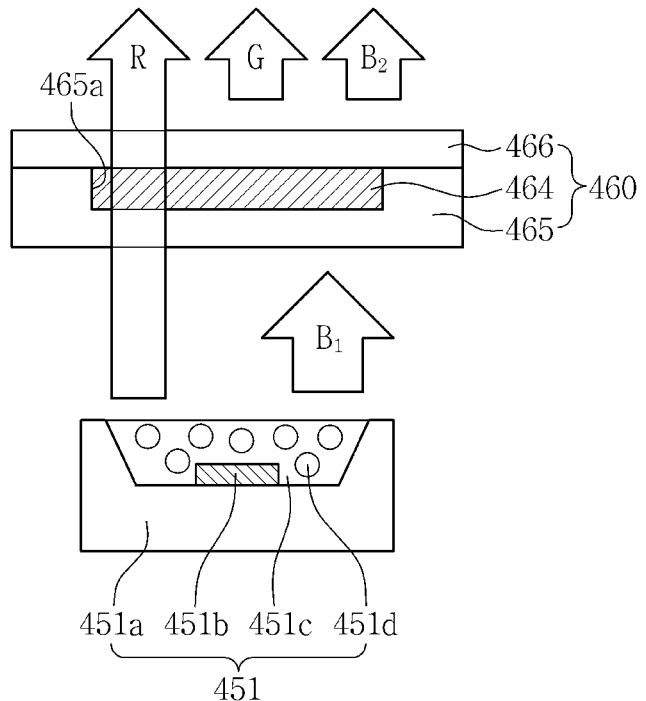
FIG. 17 is a cross-sectional view illustrating a light source and a light converting member according to still another alternative exemplary embodiment.

FIG. 17 is a cross-sectional view illustrating a light source 451 and a light converting member 460 according to another alternative exemplary embodiment.

Referring to FIG. 17, an exemplary embodiment of the light converting member 460 has a flat plate shape. The light converting member 460 includes a first glass 465, a second glass 466, and a light converting material 464.

The first glass 465 and the second glass 466 serve as the protective layer 461 (see, e.g., FIG. 3A) of an exemplary embodiment described above with reference to FIGS. 1 to 13. In an exemplary embodiment, the first glass 465 and the second glass 466 may include a light-transmissive transparent material, for example, glass. In an alternative exemplary embodiment, the first glass 465 and the second glass 466 may include a transparent electrode material having relatively high thermal conductivity, such as sapphire, zinc oxide, or magnesium oxide.

The light converting material 464 is disposed between the first glass 465 and the second glass 466, and is encapsulated by the first glass 465 and the second glass 466. In one exemplary embodiment, for example, the light converting material 464 is disposed in a groove 465a of the first glass 465, and is encapsulated by bonding the second glass 466 to the first glass 465.

The light converting material 464 has the same composition as that of the light converting layer 462 (see, e.g., FIG. 3A) of an exemplary embodiment described above with reference to FIGS. 1 to 13. The light converting material 464 includes a polymer resin and green quantum dots. In such an embodiment, a light source 451 has the same configuration as that of an exemplary embodiment described above with reference to FIGS. 1 to 13. Accordingly, light emitted from the light source 451 includes a red light R and a first blue light B1, and light emitted from the light converting member 460 is white light in which the red light R, a green light G and a second blue light B2 are mixed. In such an embodiment, the display device has the same effects as those in an exemplary embodiment described above with reference to FIGS. 1 to 13.

In such an embodiment, as shown in FIG. 17, the light converting member 460 may be disposed between a light guide plate and a display panel, between the light guide plate and the light source 451, or below a diffusion plate in a direct-type backlight unit.

Figure 18:
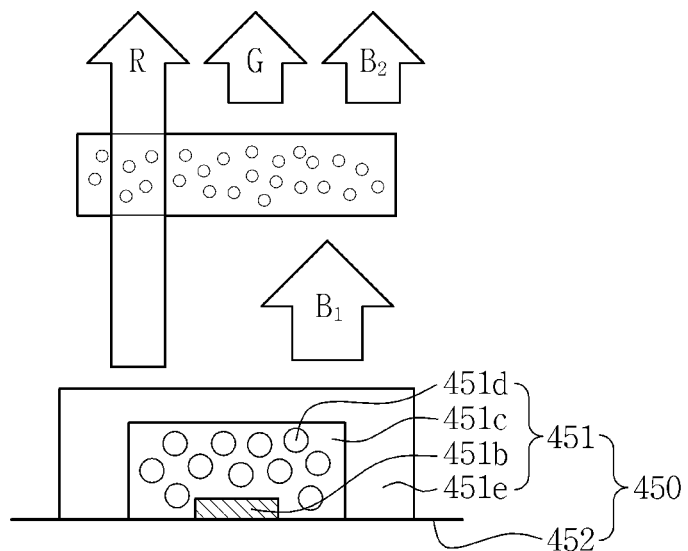
FIG. 18 is a cross-sectional view illustrating a light source and a light converting member according to still another alternative exemplary embodiment.

FIG. 18 is a cross-sectional view illustrating a light source 451 and a light converting member according to another alternative exemplary embodiment.

Referring to FIG. 18, in an exemplary embodiment of a light source unit 450, an LED 451b is mounted directly on a circuit board 452 in a chip on board ("COB") manner. A resin 451c in which red phosphors 451d are dispersed encapsulates the LED 451b. A lens 451e encapsulates the LED 451b, the resin 451c and the red phosphors 451d therein. The red phosphor 451d has the same composition as that of an exemplary embodiment described above with reference to FIGS. 1 to 13. In such an embodiment, the display device has the same configuration and effects as those in an exemplary embodiment described above with reference to FIGS. 1 to 13, except for the configuration of the light source unit 450.

Figure 19:
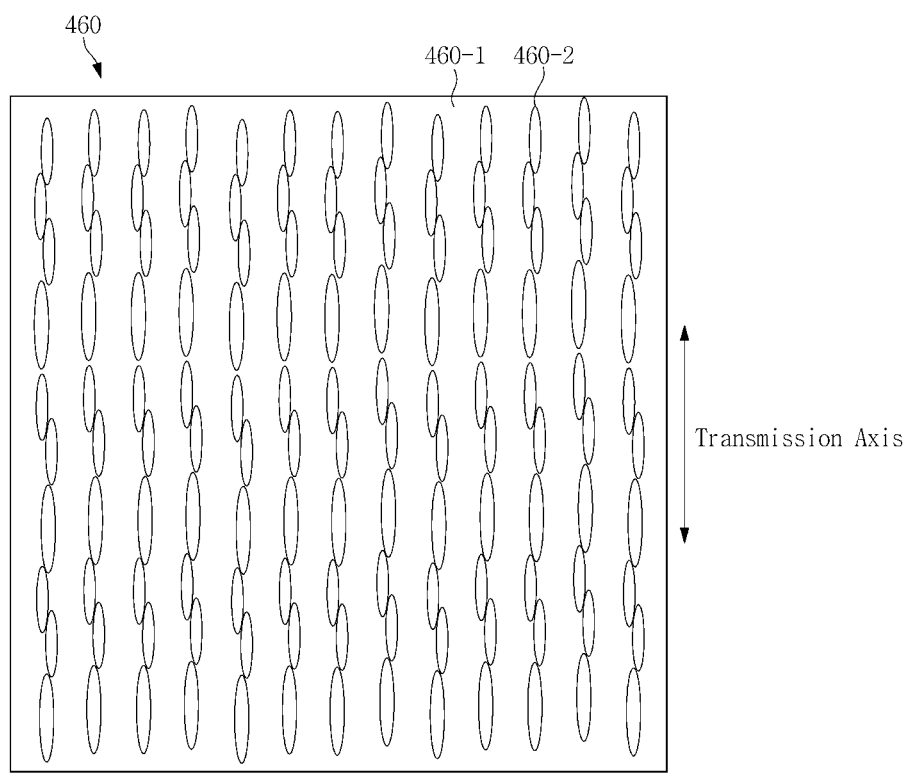
FIG. 19 is a plan view illustrating a light converting member including quantum rods according to still another alternative exemplary embodiment.
Figure 20:
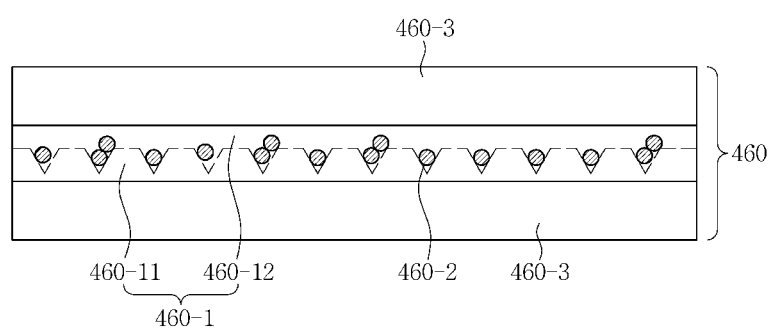
FIG. 20 is a cross-sectional view illustrating the light converting member of FIG. 19.

FIG. 19 is a plan view illustrating a light converting member 460 including quantum rods 460-2 according to another alternative exemplary embodiment. FIG. 20 is a cross-sectional view illustrating the light converting member 460 of FIG. 19.

Referring to FIGS. 19 and 20, an exemplary embodiment of the light converting member 460 includes the green quantum rods 460-2 in lieu of green quantum dots.

The light converting member 460 includes the quantum rods 460-2 arranged in a predetermined direction, and a support layer 460-1 surrounding and supporting the quantum rods 460-2.

In an exemplary embodiment, the support layer 460-1 includes a plastic resin. The plastic resin may include various materials used for forming a polymer or a film; however, the type of the materials is not particularly limited. A desired property of the plastic resin in such an exemplary embodiment includes a property of being cured to support the arrangement of the quantum rods 460-2 and a light-transmissive property, without being limited thereto.

The quantum rods 460-2 within the support layer 460-1 are arranged in a predetermined direction. Each of the quantum rods 460-2 has one of a hexagonal crystal structure, a wurtzite crystal structure, and a zinc blende crystal structure, dissimilarly to a structure of a quantum dot, which has a spherical structure. The quantum rod 460-2 may have a rod shape obtained by uniaxially growing a crystal, and may emit light of which a wavelength varies based on a size of the quantum rod 460-2.

The quantum rod 460-2 is a nanocrystal including a core including Group II-VI, III-V, and/or IV-VI semiconductor compounds, and a shell for protecting the core. The quantum rod 460-2 may further include a ligand for assisting dispersion. In one exemplary embodiment, For example, when the core of the quantum rod 460-2 includes Group II-VI semiconductor compounds, the core of the quantum rod 460-2 may include one selected from CdSe, CdS, CdTe, zinc oxide (ZnO), ZnSe, ZnS, ZnTe, HgS, HgSe, HgTe, cadmium zinc selenide (CdZnSe), and a combination thereof. In an exemplary embodiment, where the core of the quantum rod 460-2 includes Group III-V semiconductor compounds, the core of the quantum rod 460-2 may include one selected from InAs, InP, InN, GaN, InSb, InAsP, indium gallium arsenide (InGaAs), GaAs, gallium phosphide (GaP), GaSb, AlP, AlN, AlAs, AlSb, cadmium selenium telluride (CdSeTe), zinc cadmium selenide (ZnCdS), and a combination thereof. In an exemplary embodiment, where the core of the quantum rod 460-2 includes Group IV-VI semiconductor compounds, the core of the quantum rod 460-2 may include one selected from PbSe, PbTe, PbS, lead tin telluride (PbSnTe), thallium tin telluride ($Tl_2SnTe_5$), and a combination thereof.

The quantum rod 460-2 may generate fluorescent light at relatively high intensity due to having a relatively great extinction coefficient and a relatively high quantum yield as compared to those of a conventional dye. A wavelength of visible light emitted from the quantum rod 460-2 may be controlled or tuned by adjusting a size (e.g., diameter) of the quantum rod 460-2. In addition, the quantum rod 460-2 has a property of emitting linearly polarized light, and has an optical property based on the stark effect in which an electron and a hole are separated from one another to adjust light emission when an external electric field is applied thereto. Accordingly, based on such properties of the quantum rod 460-2, the display device may have enhanced light efficiency.

The quantum rod 460-2 may adjust the color of light being emitted therefrom by adjusting the materials included in the core and the shell, the size of the rod, and the like. Accordingly, a quantum rod including a material suitable for emitting green light may be provided to be applicable to the light converting members 460 in exemplary embodiments described above.

The quantum rod 460-2 may have a diameter of a few nanometers in a cross-sectional or transverse direction taken along a minor axis of the quantum rod 460-2, and may have a length of about tens or hundreds of nanometers in a major or longitudinal axis direction thereof. At least two of the quantum rods 460-2 may be arranged in an inclined manner at an angle greater than about zero degree and less than or equal to about 10 degrees with respect to the predetermined direction. In one exemplary embodiment, for example, diameters of the quantum rods 460-2 included in the light converting member 460 in the cross-sectional direction taken along the minor axis of the quantum rods 460-2 may be the same as each other. In an alternative exemplary embodiment, two different types of quantum rods 460-2 that have different diameters in a cross-sectional direction taken along a minor axis thereof may be included. In an alternative exemplary embodiment, three or more different types of quantum rods 460-2 that have different diameters in a cross-sectional direction taken along a minor axis thereof may be included. A wavelength range of light that is polarized in an extending direction of the quantum rod 460-2 varies based on a diameter of the quantum rod 460-2 in a cross-sectional direction taken along a minor axis of the quantum rod 460-2. Accordingly, in such exemplary embodiments in which the quantum rods 460-2 have various different diameters in a cross-sectional direction taken along a minor axis thereof, light having various wavelengths may be polarized in respective extending directions of the quantum rods 460-2.

The light converting member 460 as described hereinabove has a polarization property. In such an embodiment, light incident to the light converting member 460 is emitted as light polarized in an arrangement direction of the quantum rods 460-2. A direction of a transmission axis of the light converting member 460 corresponds to the arrangement direction of the quantum rods 460-2.

The light converting member 460 includes the quantum rods 460-2, the support layer 460-1 surrounding and supporting the quantum rods 460-2, and sealing layers 460-3 respectively disposed on opposing surfaces of the support layer 460-1.

The support layer 460-1 includes a first support layer 460-11 having grooves that extend in a direction and include the quantum rods 460-2 arranged therein, and a second support layer 460-12 covering the quantum rods 460-2 arranged in the grooves of the first support layer 460-11. The first and second support layers 460-11 and 460-12 may include the same material as one another, or alternatively, may include different materials from one another. The first and second support layers 460-11 and 460-12 include plastic resins. The plastic resin may include various materials used for forming a polymer or a film; however, the type of the materials is not particularly limited. A desired property of the plastic resin in the sixth exemplary embodiment includes a property of being cured to support the arrangement of the quantum rods 460-2 and a light-transmissive property, without being limited thereto.

In an exemplary embodiment, as shown in FIG. 20, each of the grooves has a V-shaped (triangular) cross section, and extends in a direction parallel to the transmission axis of the light converting member 460. The groove has the V-shaped cross section to guide the quantum rods 460-2 to be arranged in a direction. In an exemplary embodiment, as shown in FIG. 20, the number of the quantum rods 460-2 included in the groove is one or two, but not being limited thereto. In an alternative exemplary embodiment, more than one or two of the quantum rods 460-2 may be included in e groove.

The sealing layers 460-3 are disposed at opposing sides or on opposing surfaces of the support layer 460-1, respectively, to protect the support layer 460-1 and the quantum rods 460-2. Alternatively, the sealing layer 460-3 may be omitted. The sealing layer 460-3 may include a plastic resin such as polyethylene terephthalate ("PET") having relatively high light transmissivity.

Such an embodiment of the display device may have the same effects as those in an exemplary embodiment described above with reference to FIGS. 1 to 13, except for the configuration of the light converting member 460. In such an embodiment, the light converting member 460 may be employed in lieu of the light converting members 460 in exemplary embodiments described above.

Figure 21:
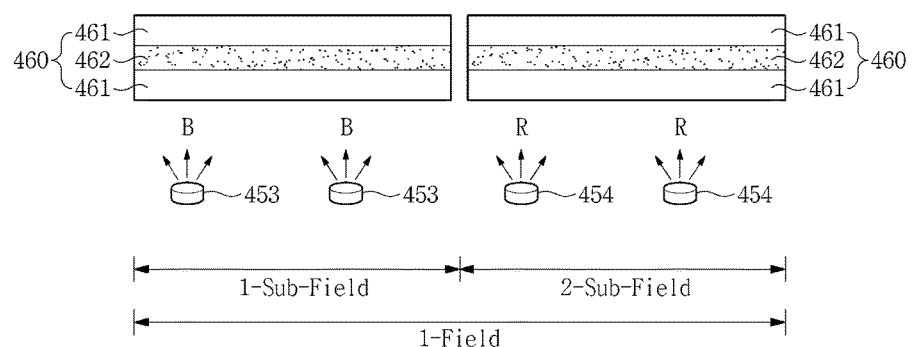
FIG. 21 is a view illustrating a full-color display mechanism based on a field sequential display ("FSD") scheme using a first light source unit and a second source unit according to still another alternative exemplary embodiment.

FIG. 21 is a view illustrating a full-color display mechanism based on a field sequential display ("FSD") scheme using a first light source unit 453 and a second light source unit 454 according to another alternative exemplary embodiment.

In an exemplary embodiment, as shown in FIG. 21, the display device may use the FSD scheme.

Referring to FIGS. 2 and 21, an exemplary embodiment of the display device includes the first light source unit 453 and the second light source unit 454. The first light source unit 453 supplies a first sub-light B in a wavelength range of about 400 nm to about 500 nm to the display panel 200. The first sub-light B corresponds to blue light. The second light source unit 454 supplies a second sub-light R in a wavelength range of about 580 nm to about 670 nm to the display panel 200. The second sub-light R corresponds to red light. The display panel 200 displays an image in a frame unit, and the first and second light source units 453 and 454 supply the first sub-light B and the second sub-light R during first and second sub-fields, respectively. The first and second sub-fields may be defined by temporally dividing a frame.

In an exemplary embodiment, for example, a light source driving unit (not illustrated) may turn on the first and second light source units 453 and 454 in an alternating manner. During the first sub-field, the first light source unit 453 is turned on and the second light source unit 454 is turned off. During the second sub-field, the first light source unit 453 is turned off and the second light source unit 454 is turned on. In one exemplary embodiment, for example, the first and second sub-fields may have the same time interval as one another. In an alternative exemplary embodiment, the first and second sub-fields may have different time intervals from one another. In such an embodiment, the display panel 200 may employ the FSD scheme.

Such an embodiment of the display device has the same effects as those in an exemplary embodiment described above with reference to FIGS. 1 to 13, except for the configuration of the first and second light source units 453 and 454 and the FSD scheme.

In one exemplary embodiment, for example, the light converting member 460 may be disposed below a color filter (not illustrated) in the display panel 200. In such an embodiment, where the light converting member 460 is disposed below the color filter, a light converting layer 462 is only disposed below the color filter, absent a protective layer 461.

Figure 22:
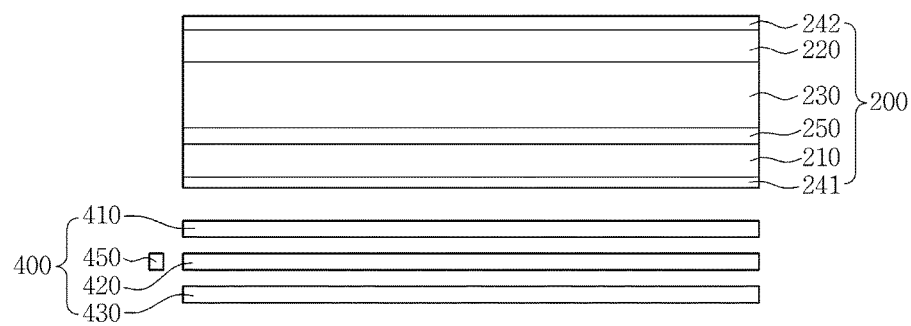
FIG. 22 is a cross-sectional view illustrating a display panel and a backlight unit according to still another alternative exemplary embodiment.
Figure 23:
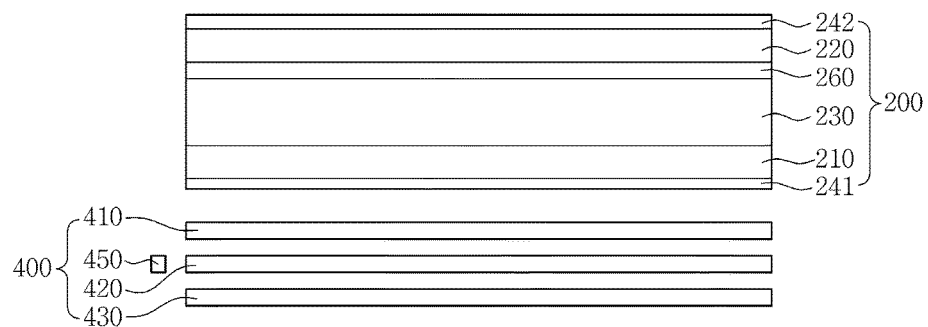
FIG. 23 is a cross-sectional view illustrating a display panel and a backlight unit according to still another alternative exemplary embodiment.

FIG. 22 is a cross-sectional view illustrating a display panel 200 and a backlight unit 400 according to an alternative exemplary embodiment. FIG. 23 is a cross-sectional view illustrating a display panel 200 and a backlight unit 400 according to another alternative exemplary embodiment.

Referring to FIG. 22, in an exemplary embodiment, the display panel 200 includes a first substrate 210, a second substrate 220 facing the first substrate 210, a liquid crystal layer 230 interposed between the first and second substrates 210 and 220, polarizers 240 attached to respective outer surfaces of the first and second substrates 210 and 220, and a light converting member 250. In a manner dissimilar to that of an exemplary embodiment described above with reference to FIGS. 1 to 13, in such an embodiment, the light converting member 250 is disposed inwardly of the display panel 200 rather than outwardly thereof. In such an embodiment of the display device, as shown in FIG. 22, the light converting member 250 is disposed between the first substrate 210 and the liquid crystal layer 230.

In an exemplary embodiment, as shown in FIG. 23, a light converting member 260 is disposed inwardly of the display panel 220. In such an embodiment, the light converting member 260 is disposed between a second substrate 220 and a liquid crystal layer 230.

Each of the light converting member 250 shown in FIG. 22 and the light converting member 260 shown in FIG. 23 may include a light converting layer 462, absent a protective layer 461.

In such an embodiment, the display device may have the same effects as those in an exemplary embodiment described above with reference to FIGS. 1 to 13, except that the light converting member 250 or 260 is disposed inwardly of the display panels 200.

Although not illustrated, the light converting member 250 or 260 may be disposed on an outer side of a first polarizer 241, or may be disposed between the first polarizer 241 and the first substrate 210. In such an embodiment, although not illustrated, the light converting member 250 or 260 may be disposed on an outer side of a second polarizer 242, or may be disposed between the second polarizer 242 and the second substrate 220.

Figure 24A:
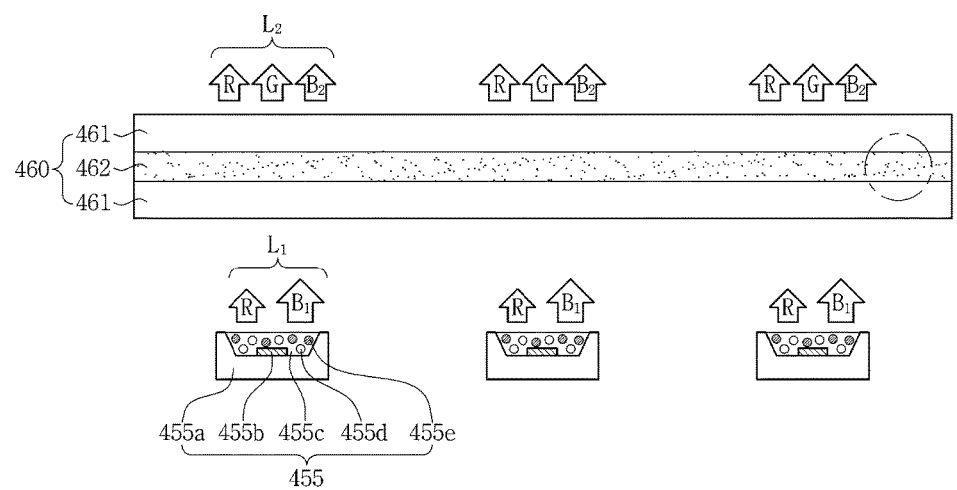
FIG. 24A is a schematic cross-sectional view illustrating a light converting member and a light source according to still another alternative exemplary embodiment.
Figure 24B:
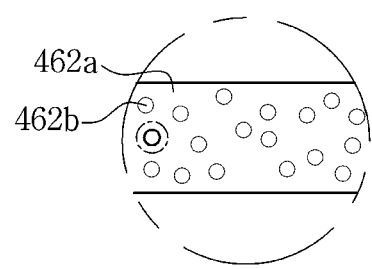
FIG. 24B is an enlarged view of the encircled portion of FIG. 24A.
Figure 24C:
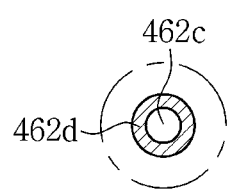
FIG. 24C is an enlarged view of the encircled portion of FIG. 24B.

FIG. 24A is a schematic cross-sectional view illustrating a light converting member 460 and a light source 455 according to another alternative exemplary embodiment, FIG. 24B is an enlarged view of the encircled portion of FIG. 24A, and FIG. 24C is an enlarged view of the encircled portion of FIG. 24B.

Referring to FIG. 24A, an exemplary embodiment of the light source 455 may further include blue phosphors 455e. In such an embodiment, an LED 455b may emit UV light.

In one exemplary embodiment, for example, the light source 455 includes an LED package. The light source 455 may include a mold 455a, the LED 455b, a resin 455c, red phosphors 455d and the blue phosphors 455e.

An accommodation space, in which the LED 455b is accommodated, is defined in the mold 455a, and the mold 455a has an open top. The mold 455a may include an insulating material. In one exemplary embodiment, for example, the mold 455a may include plastic such as polyphthalamide ("PPA").

The LED 455b is accommodated in the accommodation space of the mold 455a and emits light in a wavelength range of about 300 nm to about 400 nm. The light in the wavelength range of about 300 nm to about 400 nm corresponds to UV light.

The resin 455c is disposed on the LED 455b, and includes the red phosphors 455d and the blue phosphors 455e dispersed therein. In one exemplary embodiment, for example, the resin 455c is disposed or provided in the accommodation space of the mold 455a to encapsulate the LED 455b. The resin 455c may include an insulating material, and the insulating material may include a light-transmissive material such as, for example, a silicone resin and an epoxy resin. Accordingly, the UV light generated from the LED 455b may be transmitted through the resin 455c to be emitted externally of the light source 455, and/or may be supplied to the red phosphors 455*d* and the blue phosphors 455*e* dispersed in the resin 455*c*.

The red phosphors 455*d* are dispersed in the resin 455*c*, receive a portion of the UV light emitted from the LED 455*b*, and generate light in a wavelength range of about 580 nm to about 670 nm, which is different from the wavelength range of the UV light. The light in the wavelength range of about 580 nm to about 670 nm corresponds to a red light R. The red phosphor 455*d* may include a red inorganic phosphor.

The blue phosphors 455*e* are dispersed in the resin 455*c*, receive a portion of the UV light emitted from the LED 455*b*, and generate light in a wavelength range of about 400 nm to about 500 nm, which is different from the wavelength range of the UV light. The light in the wavelength range of about 400 nm to about 500 nm corresponds to a first blue light B1. In one exemplary embodiment, for example, the blue phosphor 455*e* may include a $BaMgAl_{10}O_{17}:Eu^{2+}$ ($BAM:Eu^{2+}$) blue-emitting phosphor, which is a compound of barium (Ba), magnesium (Mg), an aluminum oxide-based material, and europium (Eu) and has a dominant wavelength of about 450 nm, but not being limited thereto.

As such, the light source 455 may convert the UV light emitted from the LED 455*b* into the red light R and the first blue light B1 by appropriately adjusting a content ratio of the red phosphors 455*d* to the blue phosphors 455*e*.

The light source 455 may further include a UV-light blocking film (not illustrated). The UV-light blocking film may be disposed on a light emitting surface of the light source 455, and may prevent the UV light from being incident to the light converting member 460.

As set forth above, according to one or more exemplary embodiments, the display device may have enhanced luminance and color gamut, may secure the reliability of red light, may lower the manufacturing costs of the light converting member, and may reduce environmental pollution and adverse health effects.

From the foregoing, it will be appreciated that various exemplary embodiments in accordance with the invention have been described herein for purposes of illustration, and that various modifications may be made without departing from the scope and spirit of the teachings. Accordingly, the various exemplary embodiments disclosed herein are not intended to be limiting of the true scope and spirit of the teachings. Various features of the above described and other exemplary embodiments can be mixed and matched in any manner, to produce further exemplary embodiments consistent with the invention.

What is claimed is:

1. A display device comprising:
    a display panel;
    a light source which supplies light to the display panel; and
    a light converting member which converts a portion of the light emitted from the light source into light in a wavelength range of about 500 nanometers to about 580 nanometers,
    wherein the light source comprises:
        a light emitting diode; and
        red phosphors comprising a red inorganic phosphor.
2. The display device of claim 1, wherein the light emitting diode emits light in a wavelength range of about 400 nanometers to about 500 nanometers.
3. The display device of claim 1, wherein the light emitting diode emits light in a wavelength range of about 300 nanometers to about 400 nanometers.
4. The display device of claim 3, wherein the light source further comprises blue phoshors.
5. The display device of claim 1, wherein
    the light source further comprises a resin on the light emitting diode, and
    the red phosphors are dispersed in the resin.
6. The display device of claim 5, wherein a content of the red phosphors is in a range of about 2 percent by weight to about 30 percent by weight with respect to a total weight of the resin and the red phosphors.
7. The display device of claim 6, wherein the light emitted from the light source has an x coordinate in a range of about 0.1654 to about 0.255 and a y coordinate in a range of about 0.0258 to about 0.0734 based on the International Commission on Illumination (CIE) 1931 chromaticity diagram.
8. The display device of claim 6, wherein the light source emits light in a wavelength range of about 580 nm to about 670 nm and light in a wavelength range of about 400 nm to about 500 nm at a light amount ratio in a range of about 1:1.8 to about 1:29.5.
9. The display device of claim 6, wherein a light amount ratio of the light emitted from the light source and in the wavelength range of about 400 nanometers to about 500 nanometers with respect to light emitted from the light converting member and in the wavelength range of about 400 nanometers to about 500 nanometers is in a range of about 1.6:1 to about 2.7:1.
10. The display device of claim 6, wherein the light converting member emits light in a wavelength range of about 500 nanometers to about 580 nanometers and the light in the wavelength range of about 400 nanometers to about 500 nanometers at a light amount ratio in a range of about 1:1.2 to about 1:3.
11. The display device of claim 5, wherein the light source further comprises a lens which encapsulates the light emitting diode and the resin.
12. The display device of claim 11, further comprising:
    a circuit board on which the light source is disposed.
13. The display device of claim 1, wherein the light converting member comprises:
    a polymer resin; and
    green quantum dots dispersed in the polymer resin.
14. The display device of claim 13, wherein the light converting member further comprises a protective layer which seals the polymer resin.
15. The display device of claim 14, wherein the protective layer has a bar shape.
16. The display device of claim 14, wherein the protective layer comprises:
    a first glass; and
    a second glass facing the first glass.
17. The display device of claim 13, wherein the light converting member emits white light to the display panel.
18. The display device of claim 1, further comprising:
    a light guide plate which receives the light emitted from the light source incident on a side surface of the light guide plate, and emits the incident light to the display panel.
19. The display device of claim 18, wherein the light converting member is between the light guide plate and the display panel.
20. The display device of claim 18, further comprising:
    an optical sheet between the light guide plate and the display panel.
21. The display device of claim 20, wherein the light converting member is between the light guide plate and the optical sheet.

22. The display device of claim 1, further comprising:
a diffusion plate between the light source and the display panel.

23. The display device of claim 22, wherein the light converting member is between the diffusion plate and the display panel.

24. The display device of claim 1, wherein the red phosphor comprises at least one selected from a nitride-based red phosphor, a fluoride-based red phosphor, a silicate-based red phosphor, a sulfide-based red phosphor, a selenide-based red phosphor, an oxynitride-based red phosphor, a molybdate-based red phosphor, a tantalate-based red phosphor, carbide-nitride, a tungstate-based red phosphor, $Sr_2MgAl_{22}O_{36}:Mn^{4+}$, $(Ba,Sr,Ca)_2MgAl_{16}O_{27}:Eu^{2+}$, $(Ba,Sr,Ca)_2MgAl_{16}O_{27}:Mn^{2+}$, $Sr_4Al_{14}O_{460}:Eu^{2+}$, and $Mg_4O_{5.5}GeF:Mn^{4+}$.

25. The display device of claim 13, wherein the green quantum dot comprises:
a core comprising Group II-VI semiconductor compounds or Group III-V semiconductor compounds; and
an outer shell surrounding the core.

26. The display device of claim 25, wherein the core comprises at least one selected from cadmium selenide (CdSe), cadmium telluride (CdTe), cadmium sulfide (CdS), indium phosphide (InP), indium gallium phosphide (InGaP), and indium zinc phosphide (InZnP).

27. The display device of claim 25, wherein the outer shell comprises at least one selected from CdSe, zinc sulfide (ZnS), and zinc selenide sulfide (ZnSeS).

28. The display device of claim 1, wherein the display panel comprises:
a first substrate;
a second substrate facing the first substrate; and
a liquid crystal layer between the first substrate and the second substrate.

29. The display device of claim 28, wherein the light converting member is between the first substrate and the liquid crystal layer.

30. The display device of claim 28, wherein the light converting member is between the second substrate and the liquid crystal layer.

31. The display device of claim 28, wherein the display panel further comprises:
a first polarizer disposed on an outer surface of the first substrate; and
a second polarizer disposed on an outer surface of the second substrate.

32. The display device of claim 31, wherein the light converting member is disposed on an outer side of the first polarizer.

33. The display device of claim 31, wherein the light converting member is between the first polarizer and the first substrate.

34. The display device of claim 31, wherein the light converting member is disposed on an outer side of the second polarizer.

35. The display device of claim 31, wherein the light converting member is between the second polarizer and the second substrate.

36. The display device of claim 1, wherein the light converting member comprises:
a resin layer; and
green quantum rods arranged in the resin layer in a predetermined direction.

37. The display device of claim 36, wherein longitudinal axes of the green quantum rods are aligned in the predetermined direction.

38. The display device of claim 36, wherein the green quantum rod has one of a hexagonal crystal structure, a wurtzite crystal structure, and a zinc blende crystal structure.

39. A display device comprising:
a display panel;
a first light source unit which supplies a first light in a wavelength range of about 400 nanometers to about 500 nanometers to the display panel;
a second light source unit which supplies a second light in a wavelength range of about 580 nanometers to about 670 nanometers to the display panel, wherein the second light source comprises a red inorganic phosphor; and
a light converting member which converts a portion of the first light emitted from the first light source unit into light in a wavelength range of about 500 nanometers to about 580 nanometers.

40. The display device of claim 39, wherein the light converting member comprises:
a polymer resin; and
green quantum dots dispersed in the polymer resin.

41. The display device of claim 39, wherein
the display panel displays an image in a frame unit, and
the first light source unit and the second light source unit emit the first light and the second light during a first sub-field and a second sub-field, respectively,
wherein the first sub-field and the second sub-field are defined by temporally dividing a frame.

* * * * *